United States Patent
Shaked et al.

(10) Patent No.: US 12,095,599 B2
(45) Date of Patent: Sep. 17, 2024

(54) ADAPTIVE MULTI-LEVEL CODING BASED ON POWER MANAGEMENT

(71) Applicant: QUALCOMM Incorporated, San Diego, CA (US)

(72) Inventors: Ronen Shaked, Kfar Saba (IL); Yaniv Eistein, Tel Aviv (IL)

(73) Assignee: QUALCOMM Incorporated, San Diego, CA (US)

(*) Notice: Subject to any disclaimer, the term of this patent is extended or adjusted under 35 U.S.C. 154(b) by 199 days.

(21) Appl. No.: 17/663,706

(22) Filed: May 17, 2022

(65) Prior Publication Data
US 2023/0379198 A1 Nov. 23, 2023

(51) Int. Cl.
H04L 25/49 (2006.01)
H03M 13/25 (2006.01)
H04L 1/00 (2006.01)
H04W 52/26 (2009.01)

(52) U.S. Cl.
CPC ........ H04L 25/4917 (2013.01); H03M 13/25 (2013.01); H04L 1/0058 (2013.01); H04W 52/262 (2013.01)

(58) Field of Classification Search
CPC ............. H04L 25/4917; H04L 1/0058; H04L 1/0001–0005; H04L 1/0009; H04L 1/001; H04L 1/0011; H04L 1/0013; H04L 1/0014; H04L 25/49; H04L 25/497; H04L 1/004; H04L 1/0056; H04L 1/0057; H04L 1/0067; H04L 1/007; H04L 1/0075; H03M 13/25; H03M 13/251; H04W 52/262; H04W 52/04; H04W 52/18; H04W 52/26
See application file for complete search history.

(56) References Cited

U.S. PATENT DOCUMENTS

| | | | | |
|---|---|---|---|---|
| 7,205,912 B1* | 4/2007 | Yang | ............... | G11B 20/10055 714/755 |
| 7,277,498 B2* | 10/2007 | Hanaoka | ............... | H04L 1/0066 714/787 |
| 8,402,354 B2* | 3/2013 | Ogiso | ............... | H04L 25/4917 714/811 |
| 8,583,981 B2* | 11/2013 | Varnica | ............... | G06F 11/1008 714/755 |
| 8,719,670 B1* | 5/2014 | Marrow | ............... | H03M 13/251 714/755 |
| 9,166,728 B2* | 10/2015 | Djordjevic | ............... | H04J 14/06 |
| 9,172,567 B2* | 10/2015 | Hollis | ............... | H03M 5/02 |
| 9,621,385 B2* | 4/2017 | Hollis | ............... | H03M 5/02 |
| 10,924,251 B2* | 2/2021 | Tomasi | ............... | H04L 1/004 |
| 10,931,357 B2* | 2/2021 | Xu | ............... | H04L 1/0014 |
| 10,959,233 B2* | 3/2021 | Sankar | ............... | H04L 1/0075 |
| 10,965,434 B1* | 3/2021 | Babaei | ............... | H04L 5/001 |

(Continued)

Primary Examiner — James M Perez
(74) Attorney, Agent, or Firm — QUALCOMM Incorporated

(57) ABSTRACT

Various aspects of the present disclosure generally relate to wireless communication. In some aspects, a network entity may transmit, to a user equipment (UE), an indication of a multi-level coding scheme that specifies a first encoding algorithm associated with level 1 coding and a second encoding algorithm associated with level 2 coding based at least in part on power management. The network entity may communicate with the UE based at least in part on the multi-level coding scheme. Numerous other aspects are described.

26 Claims, 11 Drawing Sheets

(56) References Cited

U.S. PATENT DOCUMENTS

| | | | | |
|---|---|---|---|---|
| 11,115,059 B2* | 9/2021 | Mikami | | H03M 13/333 |
| 11,418,284 B2* | 8/2022 | Koganei | | H04L 1/0053 |
| 11,431,354 B2* | 8/2022 | Mikami | | H04L 1/0045 |
| 11,496,251 B2* | 11/2022 | Paz | | H04L 1/0643 |
| 11,522,635 B2* | 12/2022 | Sugiyama | | H04L 1/0041 |
| 11,539,557 B1* | 12/2022 | Paz | | H04L 1/0058 |
| 11,563,620 B2* | 1/2023 | Paz | | H04L 27/28 |
| 11,621,726 B1* | 4/2023 | Pan | | H04L 1/0041 |
| | | | | 714/755 |
| 11,700,081 B1* | 7/2023 | Eistein | | H04L 1/0026 |
| | | | | 714/726 |
| 11,711,247 B2* | 7/2023 | Koganei | | H03M 13/2963 |
| | | | | 375/340 |
| 11,716,237 B1* | 8/2023 | Landis | | H04L 27/2071 |
| | | | | 375/261 |
| 11,770,289 B2* | 9/2023 | Konno | | H04B 10/612 |
| | | | | 398/202 |
| 11,824,693 B2* | 11/2023 | Paz | | H04B 7/0632 |
| 11,870,617 B2* | 1/2024 | Abotabl | | H04W 72/23 |
| 2006/0153062 A1* | 7/2006 | Tanabe | | H04L 1/0057 |
| | | | | 370/208 |
| 2006/0160496 A1* | 7/2006 | Murakami | | H04L 27/3405 |
| | | | | 455/101 |
| 2010/0275092 A1* | 10/2010 | Ogiso | | H04L 25/4917 |
| | | | | 714/752 |
| 2015/0039964 A1* | 2/2015 | Fonseka | | H03M 13/2792 |
| | | | | 714/756 |
| 2015/0039965 A1* | 2/2015 | Fonseka | | H03M 13/271 |
| | | | | 714/756 |
| 2015/0092879 A1* | 4/2015 | Mansour | | H04L 1/0058 |
| | | | | 375/286 |
| 2015/0146816 A1* | 5/2015 | Hollis | | H04L 25/4915 |
| | | | | 375/288 |
| 2015/0256376 A1* | 9/2015 | Limberg | | H04L 1/08 |
| | | | | 375/261 |
| 2015/0380050 A1* | 12/2015 | Krachkovsky | | G11B 20/1833 |
| | | | | 360/40 |
| 2016/0006587 A1* | 1/2016 | Hollis | | H03M 5/02 |
| | | | | 375/288 |
| 2019/0007255 A1* | 1/2019 | Limberg | | H04L 27/38 |
| 2019/0334755 A1* | 10/2019 | Limberg | | H04L 27/28 |
| 2020/0244286 A1* | 7/2020 | Kubo | | H03M 13/1105 |
| 2020/0274647 A1* | 8/2020 | Shevchenko | | H04L 1/1819 |
| 2020/0366408 A1* | 11/2020 | Koganei | | H04L 1/0086 |
| 2020/0389348 A1* | 12/2020 | Limberg | | H04L 27/2649 |
| 2021/0075444 A1* | 3/2021 | Mikami | | H03M 13/1108 |
| 2021/0176031 A1* | 6/2021 | Babaei | | H04W 76/30 |
| 2021/0243064 A1* | 8/2021 | Limberg | | H04L 27/2697 |
| 2021/0288765 A1* | 9/2021 | Ibars Casas | | H03M 13/27 |
| 2021/0359707 A1* | 11/2021 | Mikami | | H04B 10/616 |
| 2022/0014316 A1* | 1/2022 | Levitsky | | H04L 1/0643 |
| 2022/0030525 A1* | 1/2022 | Chincholi | | H04W 52/367 |
| 2022/0038117 A1* | 2/2022 | Sugiyama | | H03M 13/2906 |
| 2022/0038204 A1* | 2/2022 | Sugiyama | | H04L 1/0003 |
| 2022/0038327 A1* | 2/2022 | Konno | | H04L 1/0058 |
| 2022/0255778 A1* | 8/2022 | Paz | | H04B 7/0632 |
| 2022/0278777 A1* | 9/2022 | Paz | | H04L 1/0058 |
| 2022/0345351 A1* | 10/2022 | Gresset | | H04L 27/3405 |
| 2023/0069705 A1* | 3/2023 | Koganei | | H04L 25/067 |
| 2023/0078989 A1* | 3/2023 | Abotabl | | H04W 72/23 |
| | | | | 370/329 |
| 2023/0084537 A1* | 3/2023 | Pan | | H04L 1/0058 |
| | | | | 714/755 |
| 2023/0170920 A1* | 6/2023 | Koganei | | H03M 13/356 |
| | | | | 714/755 |
| 2023/0246732 A1* | 8/2023 | Eistein | | H04L 5/0044 |
| | | | | 714/726 |
| 2023/0379198 A1* | 11/2023 | Shaked | | H04L 1/0058 |
| 2024/0008042 A1* | 1/2024 | Paz | | H04L 1/0058 |
| 2024/0014924 A1* | 1/2024 | Landis | | H04L 1/0003 |
| 2024/0137145 A1* | 4/2024 | Levitsky | | H04L 1/0003 |

* cited by examiner

ADAPTIVE MULTI-LEVEL CODING BASED ON POWER MANAGEMENT

FIELD OF THE DISCLOSURE

Aspects of the present disclosure generally relate to wireless communication and to techniques and apparatuses for adaptive multi-level coding based on power management.

BACKGROUND

Wireless communication systems are widely deployed to provide various telecommunication services such as telephony, video, data, messaging, and broadcasts. Typical wireless communication systems may employ multiple-access technologies capable of supporting communication with multiple users by sharing available system resources (e.g., bandwidth, transmit power, or the like). Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, time division synchronous code division multiple access (TD-SCDMA) systems, and Long Term Evolution (LTE). LTE/LTE-Advanced is a set of enhancements to the Universal Mobile Telecommunications System (UMTS) mobile standard promulgated by the Third Generation Partnership Project (3GPP).

A wireless network may include one or more base stations that support communication for a user equipment (UE) or multiple UEs. A UE may communicate with a base station via downlink communications and uplink communications. "Downlink" (or "DL") refers to a communication link from the base station to the UE, and "uplink" (or "UL") refers to a communication link from the UE to the base station.

The above multiple access technologies have been adopted in various telecommunication standards to provide a common protocol that enables different UEs to communicate on a municipal, national, regional, and/or global level. New Radio (NR), which may be referred to as 5G, is a set of enhancements to the LTE mobile standard promulgated by the 3GPP. NR is designed to better support mobile broadband internet access by improving spectral efficiency, lowering costs, improving services, making use of new spectrum, and better integrating with other open standards using orthogonal frequency division multiplexing (OFDM) with a cyclic prefix (CP) (CP-OFDM) on the downlink, using CP-OFDM and/or single-carrier frequency division multiplexing (SC-FDM) (also known as discrete Fourier transform spread OFDM (DFT-s-OFDM)) on the uplink, as well as supporting beamforming, multiple-input multiple-output (MIMO) antenna technology, and carrier aggregation. As the demand for mobile broadband access continues to increase, further improvements in LTE, NR, and other radio access technologies remain useful.

BRIEF DESCRIPTION OF THE DRAWINGS

So that the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects. The same reference numbers in different drawings may identify the same or similar elements.

SUMMARY

Figure 1:
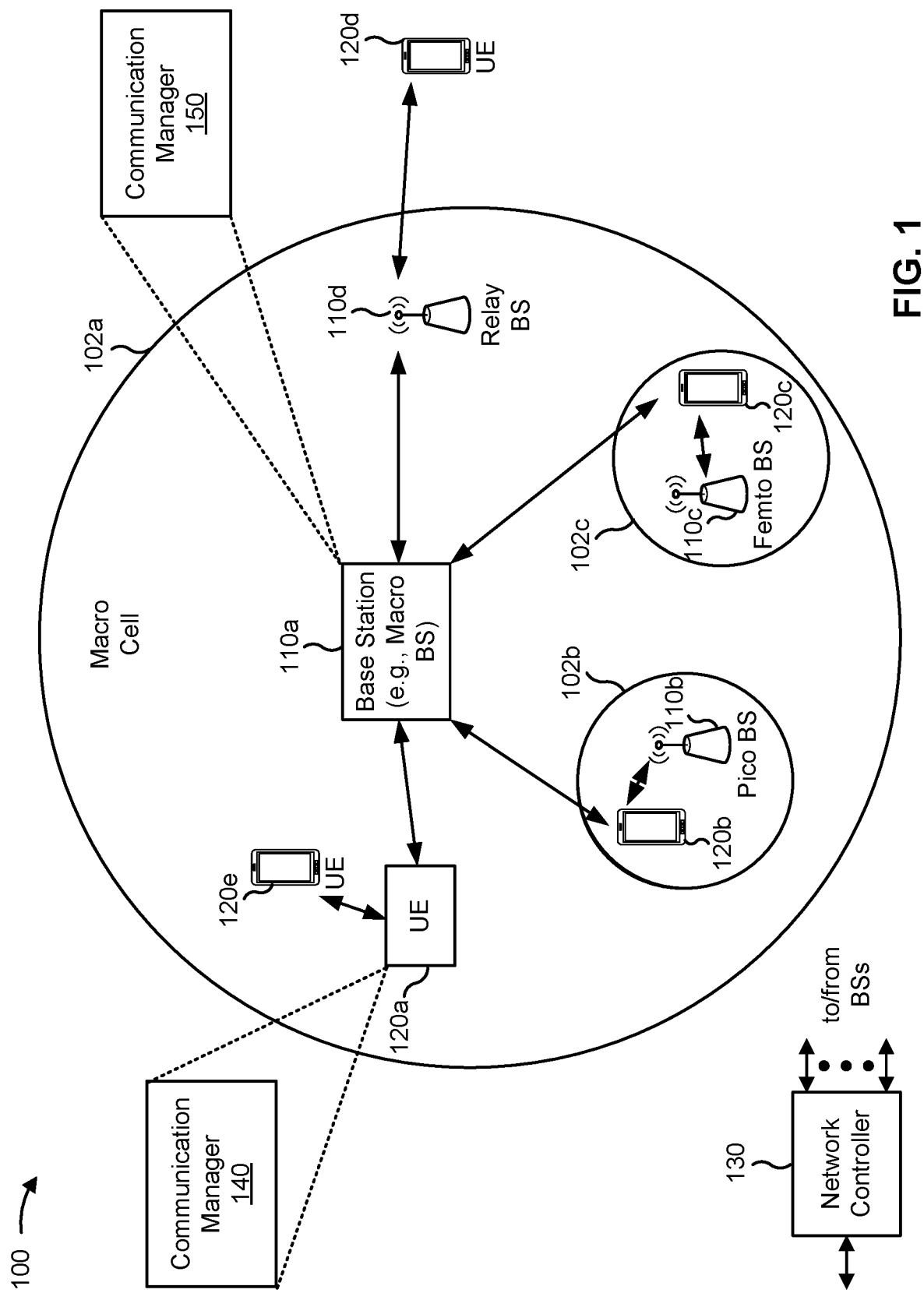
FIG. 1 is a diagram illustrating an example of a wireless network, in accordance with the present disclosure.

Some aspects described herein relate to a method of wireless communication performed by a network entity. The method may include transmitting, to a UE, an indication of a multi-level coding scheme that specifies a first encoding algorithm associated with level 1 coding and a second encoding algorithm associated with level 2 coding based at least in part on power management. The method may include communicating with the UE based at least in part on the multi-level coding scheme.

Some aspects described herein relate to a method of wireless communication performed by a UE. The method may include receiving an indication of a multi-level coding scheme that specifies a first encoding algorithm associated with level 1 coding and a second encoding algorithm associated with level 2 coding based at least in part on power management. The method may include communicating with a network entity based at least in part on the multi-level coding scheme.

Some aspects described herein relate to an apparatus for wireless communication at a network entity. The apparatus may include a memory and one or more processors coupled to the memory. The one or more processors may be configured to transmit, to a UE, an indication of a multi-level coding scheme that specifies a first encoding algorithm associated with level 1 coding and a second encoding algorithm associated with level 2 coding based at least in part on power management. The one or more processors may be configured to communicate with the UE based at least in part on the multi-level coding scheme.

Some aspects described herein relate to an apparatus for wireless communication at a UE. The apparatus may include a memory and one or more processors coupled to the memory. The one or more processors may be configured to receive an indication of a multi-level coding scheme that specifies a first encoding algorithm associated with level 1 coding and a second encoding algorithm associated with level 2 coding based at least in part on power management. The one or more processors may be configured to communicate with a network entity based at least in part on the multi-level coding scheme.

Some aspects described herein relate to a non-transitory computer-readable medium that stores a set of instructions for wireless communication by a network entity. The set of instructions, when executed by one or more processors of the network entity, may cause the network entity to transmit, to a UE, an indication of a multi-level coding scheme that specifies a first encoding algorithm associated with level 1 coding and a second encoding algorithm associated with level 2 coding based at least in part on power management. The set of instructions, when executed by one or more processors of the network entity, may cause the network entity to communicate with the UE based at least in part on the multi-level coding scheme.

Some aspects described herein relate to a non-transitory computer-readable medium that stores a set of instructions for wireless communication by a UE. The set of instructions, when executed by one or more processors of the UE, may cause the UE to receive an indication of a multi-level coding scheme that specifies a first encoding algorithm associated with level 1 coding and a second encoding algorithm associated with level 2 coding based at least in part on power management. The set of instructions, when executed by one or more processors of the UE, may cause the UE to communicate with a network entity based at least in part on the multi-level coding scheme.

Some aspects described herein relate to an apparatus for wireless communication. The apparatus may include means for transmitting, to a UE, an indication of a multi-level coding scheme that specifies a first encoding algorithm associated with level 1 coding and a second encoding algorithm associated with level 2 coding based at least in part on power management. The apparatus may include means for communicating with the UE based at least in part on the multi-level coding scheme.

Some aspects described herein relate to an apparatus for wireless communication. The apparatus may include means for receiving an indication of a multi-level coding scheme that specifies a first encoding algorithm associated with level 1 coding and a second encoding algorithm associated with level 2 coding based at least in part on power management. The apparatus may include means for communicating with a network entity based at least in part on the multi-level coding scheme.

Aspects generally include a method, apparatus, system, computer program product, non-transitory computer-readable medium, user equipment, base station, wireless communication device, and/or processing system as substantially described herein with reference to and as illustrated by the drawings and specification.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages, will be better understood from the following description when considered in connection with the accompanying figures. Each of the figures is provided for the purposes of illustration and description, and not as a definition of the limits of the claims.

While aspects are described in the present disclosure by illustration to some examples, those skilled in the art will understand that such aspects may be implemented in many different arrangements and scenarios. Techniques described herein may be implemented using different platform types, devices, systems, shapes, sizes, and/or packaging arrangements. For example, some aspects may be implemented via integrated chip embodiments or other non-module-component based devices (e.g., end-user devices, vehicles, communication devices, computing devices, industrial equipment, retail/purchasing devices, medical devices, and/or artificial intelligence devices). Aspects may be implemented in chip-level components, modular components, non-modular components, non-chip-level components, device-level components, and/or system-level components. Devices incorporating described aspects and features may include additional components and features for implementation and practice of claimed and described aspects. For example, transmission and reception of wireless signals may include one or more components for analog and digital purposes (e.g., hardware components including antennas, radio frequency (RF) chains, power amplifiers, modulators, buffers, processors, interleavers, adders, and/or summers). It is intended that aspects described herein may be practiced in a wide variety of devices, components, systems, distributed arrangements, and/or end-user devices of varying size, shape, and constitution.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. One skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

Several aspects of telecommunication systems will now be presented with reference to various apparatuses and techniques. These apparatuses and techniques will be described in the following detailed description and illustrated in the accompanying drawings by various blocks, modules, components, circuits, steps, processes, algorithms, or the like (collectively referred to as "elements"). These elements may be implemented using hardware, software, or combinations thereof. Whether such elements are implemented as hardware or software depends upon the particular application and design constraints imposed on the overall system.

While aspects may be described herein using terminology commonly associated with a 5G or New Radio (NR) radio access technology (RAT), aspects of the present disclosure can be applied to other RATs, such as a 3G RAT, a 4G RAT, and/or a RAT subsequent to 5G (e.g., 6G).

FIG. 1 is a diagram illustrating an example of a wireless network 100, in accordance with the present disclosure. The wireless network 100 may be or may include elements of a 5G (e.g., NR) network and/or a 4G (e.g., Long Term Evolution (LTE)) network, among other examples. The wireless network 100 may include one or more base stations 110 (shown as a BS 110a, a BS 110b, a BS 110c, and a BS 110d), a user equipment (UE) 120 or multiple UEs 120 (shown as a UE 120a, a UE 120b, a UE 120c, a UE 120d, and a UE 120e), and/or other network entities. A base station 110 is an entity that communicates with UEs 120. A base station 110 (sometimes referred to as a BS) may include, for example, an NR base station, an LTE base station, a Node B, an eNB (e.g., in 4G), a gNB (e.g., in 5G), an access point, and/or a transmission reception point (TRP). Each base station 110 may provide communication coverage for a particular geographic area. In the Third Generation Partnership Project (3GPP), the term "cell" can refer to a coverage area of a base station 110 and/or a base station subsystem serving this coverage area, depending on the context in which the term is used.

A base station 110 may provide communication coverage for a macro cell, a pico cell, a femto cell, and/or another type of cell. A macro cell may cover a relatively large geographic area (e.g., several kilometers in radius) and may allow unrestricted access by UEs 120 with service subscriptions. A pico cell may cover a relatively small geographic area and may allow unrestricted access by UEs 120 with service subscription. A femto cell may cover a relatively small geographic area (e.g., a home) and may allow restricted access by UEs 120 having association with the femto cell (e.g., UEs 120 in a closed subscriber group (CSG)). A base station 110 for a macro cell may be referred to as a macro base station. A base station 110 for a pico cell may be referred to as a pico base station. A base station 110 for a femto cell may be referred to as a femto base station or an in-home base station. In the example shown in FIG. 1, the BS 110a may be a macro base station for a macro cell 102a, the BS 110b may be a pico base station for a pico cell 102b, and the BS 110c may be a femto base station for a femto cell 102c. A base station may support one or multiple (e.g., three) cells.

In some examples, a cell may not necessarily be stationary, and the geographic area of the cell may move according to the location of a base station 110 that is mobile (e.g., a mobile base station). In some examples, the base stations 110 may be interconnected to one another and/or to one or more other base stations 110 or network nodes (not shown) in the wireless network 100 through various types of backhaul interfaces, such as a direct physical connection or a virtual network, using any suitable transport network.

Deployment of communication systems, such as 5G New Radio (NR) systems, may be arranged in multiple manners with various components or constituent parts. In a 5G NR system, or network, a network node, a network entity, a mobility element of a network, a radio access network (RAN) node, a core network node, a network element, a base station, or a network equipment may be implemented in an aggregated or disaggregated architecture. For example, a base station (such as a Node B (NB), evolved NB (eNB), NR base station (BS), 5G NB, gNodeB (gNB), access point (AP), transmit receive point (TRP), or cell), or one or more units (or one or more components) performing base station functionality, may be implemented as an aggregated base station (also known as a standalone base station or a monolithic base station) or a disaggregated base station. "Network entity" or "network node" may refer to a disaggregated base station, or to one or more units of a disaggregated base station (such as one or more CUs, one or more DUs, one or more RUs, or a combination thereof).

An aggregated base station may be configured to utilize a radio protocol stack that is physically or logically integrated within a single RAN node (for example, within a single device or unit). A disaggregated base station may be configured to utilize a protocol stack that is physically or logically distributed among two or more units (such as one or more CUs, one or more DUs, or one or more RUs). In some aspects, a CU may be implemented within a RAN node, and one or more DUs may be co-located with the CU, or alternatively, may be geographically or virtually distributed throughout one or multiple other RAN nodes. The DUs may be implemented to communicate with one or more RUs. Each of the CU, DU, and RU also may be implemented as virtual units (e.g., a virtual central unit (VCU), a virtual distributed unit (VDU), or a virtual radio unit (VRU)).

Base station-type operation or network design may consider aggregation characteristics of base station functionality. For example, disaggregated base stations may be utilized in an integrated access backhaul (IAB) network, an open radio access network (O-RAN (such as the network configuration sponsored by the O-RAN Alliance)), or a virtualized radio access network (vRAN, also known as a cloud radio access network (C-RAN)) to facilitate scaling of communication systems by separating base station functionality into one or more units that may be individually deployed. A disaggregated base station may include functionality implemented across two or more units at various physical locations, as well as functionality implemented for at least one unit virtually, which may enable flexibility in network design. The various units of the disaggregated base station may be configured for wired or wireless communication with at least one other unit of the disaggregated base station.

The wireless network 100 may include one or more relay stations. A relay station is an entity that can receive a transmission of data from an upstream station (e.g., a base station 110 or a UE 120) and send a transmission of the data to a downstream station (e.g., a UE 120 or a base station 110). A relay station may be a UE 120 that can relay transmissions for other UEs 120. In the example shown in FIG. 1, the BS 110d (e.g., a relay base station) may communicate with the BS 110a (e.g., a macro base station) and the UE 120d in order to facilitate communication between the BS 110a and the UE 120d. A base station 110 that relays communications may be referred to as a relay station, a relay base station, a relay, or the like.

The wireless network 100 may be a heterogeneous network that includes base stations 110 of different types, such as macro base stations, pico base stations, femto base stations, relay base stations, or the like. These different types of base stations 110 may have different transmit power levels, different coverage areas, and/or different impacts on interference in the wireless network 100. For example, macro base stations may have a high transmit power level (e.g., 5 to 40 watts) whereas pico base stations, femto base stations, and relay base stations may have lower transmit power levels (e.g., 0.1 to 2 watts).

A network controller 130 may couple to or communicate with a set of base stations 110 and may provide coordination and control for these base stations 110. The network controller 130 may communicate with the base stations 110 via a backhaul communication link. The base stations 110 may communicate with one another directly or indirectly via a wireless or wireline backhaul communication link.

The UEs 120 may be dispersed throughout the wireless network 100, and each UE 120 may be stationary or mobile. A UE 120 may include, for example, an access terminal, a terminal, a mobile station, and/or a subscriber unit. A UE 120 may be a cellular phone (e.g., a smart phone), a personal digital assistant (PDA), a wireless modem, a wireless communication device, a handheld device, a laptop computer, a cordless phone, a wireless local loop (WLL) station, a tablet, a camera, a gaming device, a netbook, a smartbook, an ultrabook, a medical device, a biometric device, a wearable device (e.g., a smart watch, smart clothing, smart glasses, a smart wristband, smart jewelry (e.g., a smart ring or a smart bracelet)), an entertainment device (e.g., a music device, a video device, and/or a satellite radio), a vehicular component or sensor, a smart meter/sensor, industrial manufacturing equipment, a global positioning system device, and/or any other suitable device that is configured to communicate via a wireless medium.

Some UEs 120 may be considered machine-type communication (MTC) or evolved or enhanced machine-type communication (eMTC) UEs. An MTC UE and/or an eMTC UE may include, for example, a robot, a drone, a remote device, a sensor, a meter, a monitor, and/or a location tag, that may communicate with a base station, another device (e.g., a remote device), or some other entity. Some UEs 120 may be considered Internet-of-Things (IoT) devices, and/or may be implemented as NB-IoT (narrowband IoT) devices. Some UEs 120 may be considered a Customer Premises Equipment. A UE 120 may be included inside a housing that houses components of the UE 120, such as processor components and/or memory components. In some examples, the processor components and the memory components may be coupled together. For example, the processor components (e.g., one or more processors) and the memory components (e.g., a memory) may be operatively coupled, communicatively coupled, electronically coupled, and/or electrically coupled.

In general, any number of wireless networks 100 may be deployed in a given geographic area. Each wireless network 100 may support a particular RAT and may operate on one or more frequencies. A RAT may be referred to as a radio technology, an air interface, or the like. A frequency may be referred to as a carrier, a frequency channel, or the like. Each frequency may support a single RAT in a given geographic area in order to avoid interference between wireless networks of different RATs. In some cases, NR or 5G RAT networks may be deployed.

In some examples, two or more UEs 120 (e.g., shown as UE 120a and UE 120e) may communicate directly using one or more sidelink channels (e.g., without using a base station 110 as an intermediary to communicate with one another). For example, the UEs 120 may communicate using peer-to-peer (P2P) communications, device-to-device (D2D) communications, a vehicle-to-everything (V2X) protocol (e.g., which may include a vehicle-to-vehicle (V2V) protocol, a vehicle-to-infrastructure (V2I) protocol, or a vehicle-to-pedestrian (V2P) protocol), and/or a mesh network. In such examples, a UE 120 may perform scheduling operations, resource selection operations, and/or other operations described elsewhere herein as being performed by the base station 110.

Devices of the wireless network 100 may communicate using the electromagnetic spectrum, which may be subdivided by frequency or wavelength into various classes, bands, channels, or the like. For example, devices of the wireless network 100 may communicate using one or more operating bands. In 5G NR, two initial operating bands have been identified as frequency range designations FR1 (410 MHz-7.125 GHz) and FR2 (24.25 GHz-52.6 GHz). It should be understood that although a portion of FR1 is greater than 6 GHz, FR1 is often referred to (interchangeably) as a "Sub-6 GHz" band in various documents and articles. A similar nomenclature issue sometimes occurs with regard to FR2, which is often referred to (interchangeably) as a "millimeter wave" band in documents and articles, despite being different from the extremely high frequency (EHF) band (30 GHz-300 GHz) which is identified by the International Telecommunications Union (ITU) as a "millimeter wave" band.

The frequencies between FR1 and FR2 are often referred to as mid-band frequencies. Recent 5G NR studies have identified an operating band for these mid-band frequencies as frequency range designation FR3 (7.125 GHz-24.25 GHz). Frequency bands falling within FR3 may inherit FR1 characteristics and/or FR2 characteristics, and thus may effectively extend features of FR1 and/or FR2 into mid-band frequencies. In addition, higher frequency bands are currently being explored to extend 5G NR operation beyond 52.6 GHz. For example, three higher operating bands have been identified as frequency range designations FR4a or FR4-1 (52.6 GHz-71 GHz), FR4 (52.6 GHz-114.25 GHz), and FR5 (114.25 GHz-300 GHz). Each of these higher frequency bands falls within the EHF band.

With the above examples in mind, unless specifically stated otherwise, it should be understood that the term "sub-6 GHz" or the like, if used herein, may broadly represent frequencies that may be less than 6 GHz, may be within FR1, or may include mid-band frequencies. Further, unless specifically stated otherwise, it should be understood that the term "millimeter wave" or the like, if used herein, may broadly represent frequencies that may include mid-band frequencies, may be within FR2, FR4, FR4-a or FR4-1, and/or FR5, or may be within the EHF band. It is contemplated that the frequencies included in these operating bands (e.g., FR1, FR2, FR3, FR4, FR4-a, FR4-1, and/or FR5) may be modified, and techniques described herein are applicable to those modified frequency ranges.

In some aspects, the network entity may include a communication manager 150. As described in more detail elsewhere herein, the communication manager 150 may transmit, to a UE, an indication of a multi-level coding scheme that specifies a first encoding algorithm associated with level 1 coding and a second encoding algorithm associated with level 2 coding based at least in part on power management; and communicate with the UE based at least in part on the multi-level coding scheme. Additionally, or alternatively, the communication manager 150 may perform one or more other operations described herein.

In some aspects, the UE 120 may include a communication manager 140. As described in more detail elsewhere herein, the communication manager 140 may receive an indication of a multi-level coding scheme that specifies a first encoding algorithm associated with level 1 coding and a second encoding algorithm associated with level 2 coding based at least in part on power management; and communicate with a network entity based at least in part on the multi-level coding scheme. Additionally, or alternatively, the communication manager 140 may perform one or more other operations described herein.

As indicated above, FIG. 1 is provided as an example. Other examples may differ from what is described with regard to FIG. 1.

Figure 2:
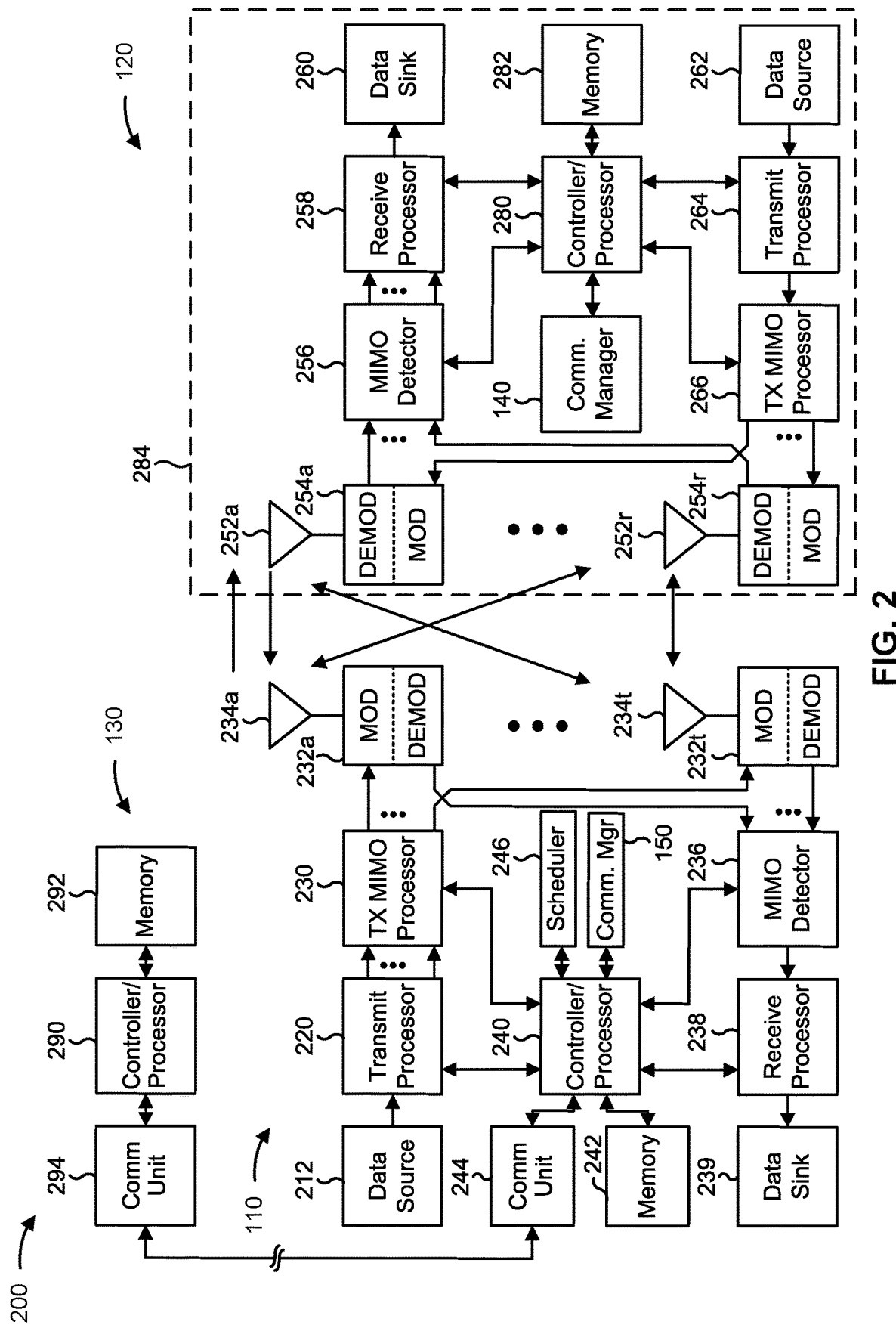
FIG. 2 is a diagram illustrating an example of a base station in communication with a UE in a wireless network, in accordance with the present disclosure.

FIG. 2 is a diagram illustrating an example 200 of a base station 110 in communication with a UE 120 in a wireless network 100, in accordance with the present disclosure. The base station 110 may be equipped with a set of antennas 234a through 234t, such as T antennas (T≥1). The UE 120 may be equipped with a set of antennas 252a through 252r, such as R antennas (R≥1).

At the base station 110, a transmit processor 220 may receive data, from a data source 212, intended for the UE 120 (or a set of UEs 120). The transmit processor 220 may select one or more modulation and coding schemes (MCSs) for the UE 120 based at least in part on one or more channel quality indicators (CQIs) received from that UE 120. The base station 110 may process (e.g., encode and modulate) the data for the UE 120 based at least in part on the MCS(s) selected for the UE 120 and may provide data symbols for the UE 120. The transmit processor 220 may process system information (e.g., for semi-static resource partitioning information (SRPI)) and control information (e.g., CQI requests, grants, and/or upper layer signaling) and provide overhead symbols and control symbols. The transmit processor 220 may generate reference symbols for reference signals (e.g., a cell-specific reference signal (CRS) or a demodulation reference signal (DMRS)) and synchronization signals (e.g., a primary synchronization signal (PSS) or a secondary synchronization signal (SSS)). A transmit (TX) multiple-input multiple-output (MIMO) processor 230 may perform spatial processing (e.g., precoding) on the data symbols, the control symbols, the overhead symbols, and/or the reference symbols, if applicable, and may provide a set of output symbol streams (e.g., T output symbol streams) to a corresponding set of modems 232 (e.g., T modems), shown as modems 232a through 232t. For example, each output symbol stream may be provided to a modulator component (shown as MOD) of a modem 232. Each modem 232 may use a respective modulator component to process a respective output symbol stream (e.g., for OFDM) to obtain an output sample stream. Each modem 232 may further use a respective modulator component to process (e.g., convert to analog, amplify, filter, and/or upconvert) the output sample stream to obtain a downlink signal. The modems 232a through 232t may transmit a set of downlink signals (e.g., T downlink signals) via a corresponding set of antennas 234 (e.g., T antennas), shown as antennas 234a through 234t.

At the UE 120, a set of antennas 252 (shown as antennas 252a through 252r) may receive the downlink signals from the base station 110 and/or other base stations 110 and may provide a set of received signals (e.g., R received signals) to a set of modems 254 (e.g., R modems), shown as modems 254a through 254r. For example, each received signal may be provided to a demodulator component (shown as DEMOD) of a modem 254. Each modem 254 may use a respective demodulator component to condition (e.g., filter, amplify, downconvert, and/or digitize) a received signal to obtain input samples. Each modem 254 may use a demodulator component to further process the input samples (e.g., for OFDM) to obtain received symbols. A MIMO detector 256 may obtain received symbols from the modems 254, may perform MIMO detection on the received symbols if applicable, and may provide detected symbols. A receive processor 258 may process (e.g., demodulate and decode) the detected symbols, may provide decoded data for the UE 120 to a data sink 260, and may provide decoded control information and system information to a controller/processor 280. The term "controller/processor" may refer to one or more controllers, one or more processors, or a combination thereof. A channel processor may determine a reference signal received power (RSRP) parameter, a received signal strength indicator (RSSI) parameter, a reference signal received quality (RSRQ) parameter, and/or a CQI parameter, among other examples. In some examples, one or more components of the UE 120 may be included in a housing 284.

The network controller 130 may include a communication unit 294, a controller/processor 290, and a memory 292. The network controller 130 may include, for example, one or more devices in a core network. The network controller 130 may communicate with the base station 110 via the communication unit 294.

One or more antennas (e.g., antennas 234a through 234t and/or antennas 252a through 252r) may include, or may be included within, one or more antenna panels, one or more antenna groups, one or more sets of antenna elements, and/or one or more antenna arrays, among other examples. An antenna panel, an antenna group, a set of antenna elements, and/or an antenna array may include one or more antenna elements (within a single housing or multiple housings), a set of coplanar antenna elements, a set of non-coplanar antenna elements, and/or one or more antenna elements coupled to one or more transmission and/or reception components, such as one or more components of FIG. 2.

On the uplink, at the UE 120, a transmit processor 264 may receive and process data from a data source 262 and control information (e.g., for reports that include RSRP, RSSI, RSRQ, and/or CQI) from the controller/processor 280. The transmit processor 264 may generate reference symbols for one or more reference signals. The symbols from the transmit processor 264 may be precoded by a TX MIMO processor 266 if applicable, further processed by the modems 254 (e.g., for DFT-s-OFDM or CP-OFDM), and transmitted to the base station 110. In some examples, the modem 254 of the UE 120 may include a modulator and a demodulator. In some examples, the UE 120 includes a transceiver. The transceiver may include any combination of the antenna(s) 252, the modem(s) 254, the MIMO detector 256, the receive processor 258, the transmit processor 264, and/or the TX MIMO processor 266. The transceiver may be used by a processor (e.g., the controller/processor 280) and the memory 282 to perform aspects of any of the methods described herein (e.g., with reference to FIGS. 3-9).

At the base station 110, the uplink signals from UE 120 and/or other UEs may be received by the antennas 234, processed by the modem 232 (e.g., a demodulator component, shown as DEMOD, of the modem 232), detected by a MIMO detector 236 if applicable, and further processed by a receive processor 238 to obtain decoded data and control information sent by the UE 120. The receive processor 238 may provide the decoded data to a data sink 239 and provide the decoded control information to the controller/processor 240. The base station 110 may include a communication unit 244 and may communicate with the network controller 130 via the communication unit 244. The base station 110 may include a scheduler 246 to schedule one or more UEs 120 for downlink and/or uplink communications. In some examples, the modem 232 of the base station 110 may include a modulator and a demodulator. In some examples, the base station 110 includes a transceiver. The transceiver may include any combination of the antenna(s) 234, the modem(s) 232, the MIMO detector 236, the receive processor 238, the transmit processor 220, and/or the TX MIMO processor 230. The transceiver may be used by a processor (e.g., the controller/processor 240) and the memory 242 to perform aspects of any of the methods described herein (e.g., with reference to FIGS. 3-9).

The controller/processor 240 of the base station 110, the controller/processor 280 of the UE 120, and/or any other component(s) of FIG. 2 may perform one or more techniques associated with adaptive multi-level coding based on power management, as described in more detail elsewhere herein. For example, the controller/processor 240 of the base station 110, the controller/processor 280 of the UE 120, and/or any other component(s) of FIG. 2 may perform or direct operations of, for example, process 800 of FIG. 8, process 900 of FIG. 9, and/or other processes as described herein. The memory 242 and the memory 282 may store data and program codes for the base station 110 and the UE 120, respectively. In some examples, the memory 242 and/or the memory 282 may include a non-transitory computer-readable medium storing one or more instructions (e.g., code and/or program code) for wireless communication. For example, the one or more instructions, when executed (e.g., directly, or after compiling, converting, and/or interpreting) by one or more processors of the base station 110 and/or the UE 120, may cause the one or more processors, the UE 120, and/or the base station 110 to perform or direct operations of, for example, process 800 of FIG. 8, process 900 of FIG. 9, and/or other processes as described herein. In some examples, executing instructions may include running the instructions, converting the instructions, compiling the instructions, and/or interpreting the instructions, among other examples.

In some aspects, a network entity includes means for transmitting, to a UE, an indication of a multi-level coding scheme that specifies a first encoding algorithm associated with level 1 coding and a second encoding algorithm associated with level 2 coding based at least in part on power management; and/or means for communicating with the UE based at least in part on the multi-level coding scheme. In some aspects, the means for the network entity to perform operations described herein may include, for example, one or more of communication manager 150, transmit processor 220, TX MIMO processor 230, modem 232, antenna 234, MIMO detector 236, receive processor 238, controller/processor 240, memory 242, or scheduler 246.

In some aspects, a UE includes means for receiving an indication of a multi-level coding scheme that specifies a first encoding algorithm associated with level 1 coding and a second encoding algorithm associated with level 2 coding based at least in part on power management; and/or means for communicating with a network entity based at least in part on the multi-level coding scheme. The means for the UE to perform operations described herein may include, for example, one or more of communication manager 140, antenna 252, modem 254, MIMO detector 256, receive processor 258, transmit processor 264, TX MIMO processor 266, controller/processor 280, or memory 282.

While blocks in FIG. 2 are illustrated as distinct components, the functions described above with respect to the blocks may be implemented in a single hardware, software, or combination component or in various combinations of components. For example, the functions described with respect to the transmit processor 264, the receive processor 258, and/or the TX MIMO processor 266 may be performed by or under the control of the controller/processor 280.

As indicated above, FIG. 2 is provided as an example. Other examples may differ from what is described with regard to FIG. 2.

Figure 3:
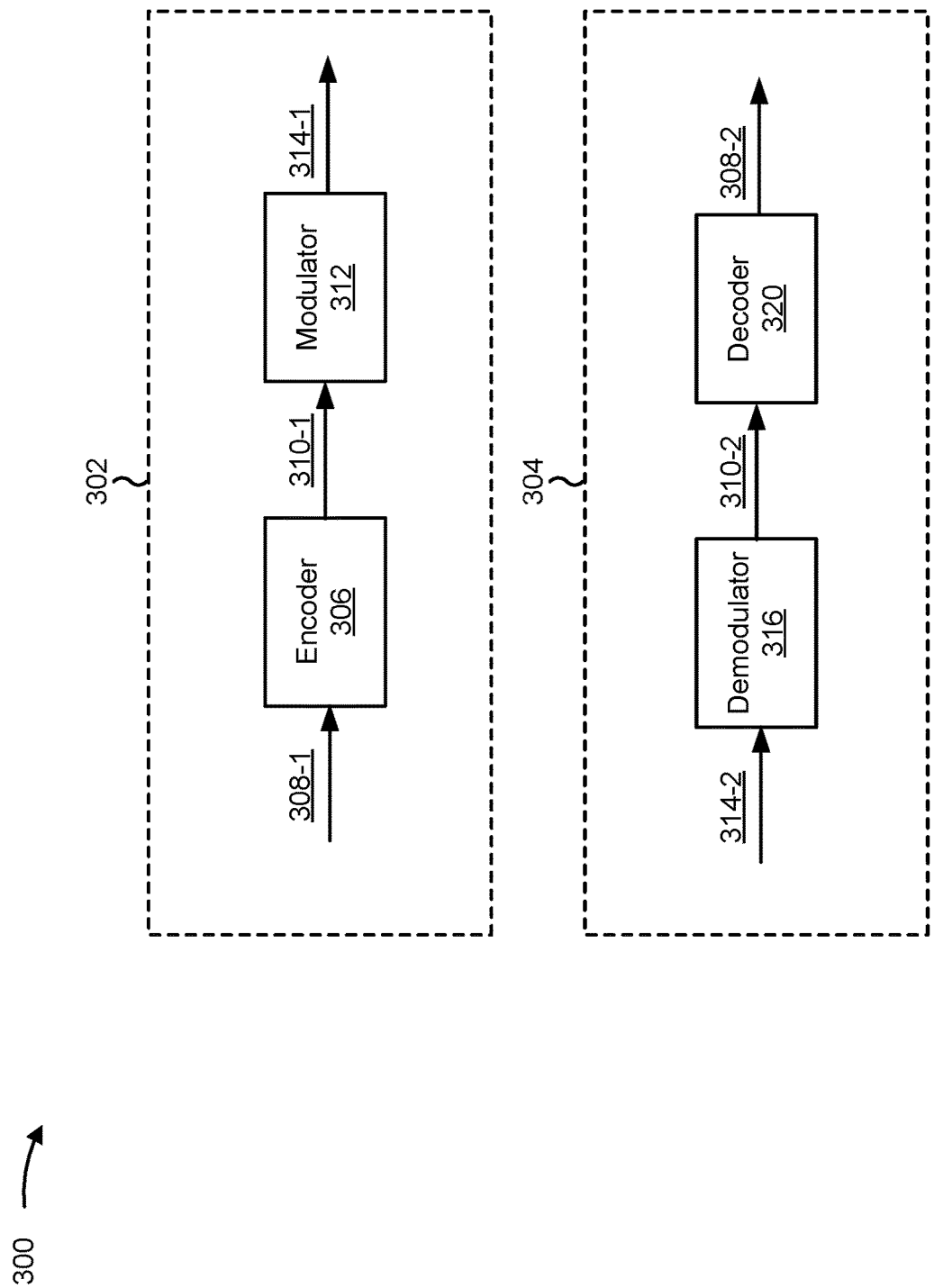
FIG. 3 is a diagram illustrating an example of a first block diagram of bit encoding that may be implemented in a transmitter and a second block diagram of bit decoding that may be implemented in a receiver, in accordance with the present disclosure.

FIG. 3 is a diagram illustrating an example 300 of a first block diagram 302 of bit encoding that may be implemented in a transmitter and a second block diagram 304 of bit decoding that may be implemented in a receiver, in accordance with the present disclosure.

A wireless communication system may use an encoding algorithm to transmit data reliably between devices. As one example, a low-density parity-check (LDPC) encoding algorithm or a Reed-Solomon encoding algorithm at a transmitter may encode a data stream with redundant information and/or error correction information such that a receiver with a complementary LDPC or Reed-Solomon decoding algorithm may correct for recovery errors that are based at least in part on a distortion in the received signal. In some aspects, the term "coding" may refer to both encoding at a transmitter and complementary decoding at a receiver.

The first block diagram 302 may represent a single-level encoder that encodes data based at least in part on a single encoding algorithm. As one example, an encoder 306 may implement an LDPC encoding algorithm and/or a Reed-Solomon encoding algorithm. The encoder 306 may receive one or more bits 308-1 as an input and generate, as an output, one or more encoded bits 310-1 based at least in part on an encoding algorithm. In some aspects, the encoder 306 may implement multiple encoding algorithms and be programmed and/or instructed to use one of the multiple algorithms as the single encoding algorithm. As shown by the first block diagram 302, a modulator 312 may receive the encoded bits 310-1 as input and generate a modulated signal 314-1 based at least in part on the encoded bits 310-1. To illustrate, a quadrature amplitude modulation (QAM) modulator may generate in-phase and quadrature (I/Q) coefficients that are based at least in part on mapping the encoded bits to a constellation (e.g., a 16 QAM constellation, a 64 QAM constellation, or a 1024 QAM constellation).

As shown by the second block diagram 304, a demodulator 316 may receive a modulated signal 314-2 that may include distortion that causes the modulated signal 314-2 to deviate from the modulated signal 314-1. For instance, the modulated signal 314-1 may transform into the modulated signal 314-2 while propagating through a communication channel. The demodulator 316 may recover one or more encoded bits 310-2 based at least in part on processing the modulated signal 314-2. To illustrate, the demodulator 316 may be a QAM demodulator that includes a log likelihood ratio (LLR) calculator that recovers the encoded bits 310-2 based at least in part on estimating points on a corresponding constellation. In some aspects, the encoded bits 310-2 may vary from the encoded bits 310-1. A decoder 320 may receive the encoded bits 310-2 and recover one or more bits 308-2 based at least in part on a decoding algorithm that is complementary to the encoding algorithm utilized by the encoder 306. By using the encoder 306 and the decoder 320, a wireless network may reduce errors between the one or more (recovered) bits 308-2 and the one or more (source) bits 308-1. The encoder 306, the modulator 312, the demodulator 316, and/or the decoder 320 may be implemented using any combination of software, hardware, and/or firmware.

Different encoding algorithms may consume power at different rates and/or different levels. To illustrate, a first encoding algorithm may be more complex relative to a second encoding algorithm, such as by involving more steps and/or more calculations. Thus, a first encoder that encodes bits based at least in part on the first, more complex encoding algorithm may be performing more computations for a longer time duration relative to a second encoder that encodes bits based at least in part on the second, less complex encoding algorithm. Similarly, a first decoder that decodes the bits based at least in part on the first, more complex encoding algorithm may be performing more computations for a longer time duration relative to a second decoder that decodes the bits based at least in part on the second, less complex encoding algorithm. In some aspects, the more complex encoding algorithm may provide better protection against recovery errors relative to the less complex encoding algorithm.

A capacity of an encoding algorithm may be based at least in part on an associated modulation algorithm and/or channel quality. To illustrate, a QAM symbol may be associated with multiple bits (e.g., a 1024 QAM symbol may be associated with 10 bits, a 64 QAM symbol may be associated with 6 bits, and a 16 QAM symbol may be associated with 4 bits). Based at least in part on some channel conditions (e.g., that may be characterized by a signal-to-noise-ratio (SNR) metric), a signal propagating through a communication channel may experience distortion. In some aspects, some bits within the QAM symbol may be more prone to bit error and, accordingly, reduce a capacity of the encoding algorithm associated with the bits represented by the QAM symbol. An encoder that implements a more complex encoding algorithm may experience reduced capacity (and more bit errors) based at least in part on a channel quality and/or the associated modulation algorithm. The reduced capacity may cause the encoder to needlessly consume power and drain resources within the wireless network (e.g., a battery life of a UE). To illustrate, the encoder operating based at least in part on the more complex encoding algorithm may consume power resources without providing the additional protection (e.g., relative to a less complex encoding algorithm) against recovery errors for at least some of the bits of a symbol. The drain in power resources may shorten a battery life of a UE and/or shorten the UE's connectivity to the wireless network.

Some techniques and apparatuses described herein provide adaptive multi-level coding based on power management. A network entity may transmit, to a UE, an indication of a multi-level coding scheme that specifies a first encoding algorithm associated with level 1 coding and a second encoding algorithm associated with level 2 coding based at least in part on power management. In some aspects, the network entity may select the first encoding algorithm and/or the second encoding algorithm based at least in part on reducing power consumption in a wireless network relative to power consumption that is based at least in part on a single encoding algorithm. The network entity may then communicate with the UE based at least in part on the multi-level coding scheme, such as by using the first encoding algorithm to encode and/or decode level 1 bits and the second encoding algorithm to encode and/or decode level 2 bits.

In some aspects, a UE may receive, from a network entity, an indication of a multi-level coding scheme that specifies a first encoding algorithm associated with level 1 coding and a second encoding algorithm associated with level 2 coding based at least in part on power management. As one example, the UE may receive the indication based at least in part on transmitting a signal metric (e.g., SNR or RSRP) to the network entity. The UE may then communicate with the network entity based at least in part on the multi-level coding scheme. To illustrate, the UE may use the first encoding algorithm to encode and/or decode level 1 bits and the second encoding algorithm to encode and/or decode level 2 bits.

By utilizing different encoding algorithms for multi-level coding, a network entity may reduce power consumption in a wireless network. To illustrate, the network entity may identify a channel condition in which a more complex encoding algorithm provides the same and/or commensurate (e.g., within a threshold value and/or within a range) protection against bit errors relative to a less complex encoding algorithm. The network entity may dynamically switch (and/or instruct a UE to dynamically switch) to the less complex encoding algorithm for at least some bits associated with a symbol and reduce power consumption within the wireless network. Reducing power consumption may extend a battery life of a UE and extend the UE's connectivity to the wireless network.

As indicated above, FIG. 3 is provided as an example. Other examples may differ from what is described with regard to FIG. 3.

Figure 4:
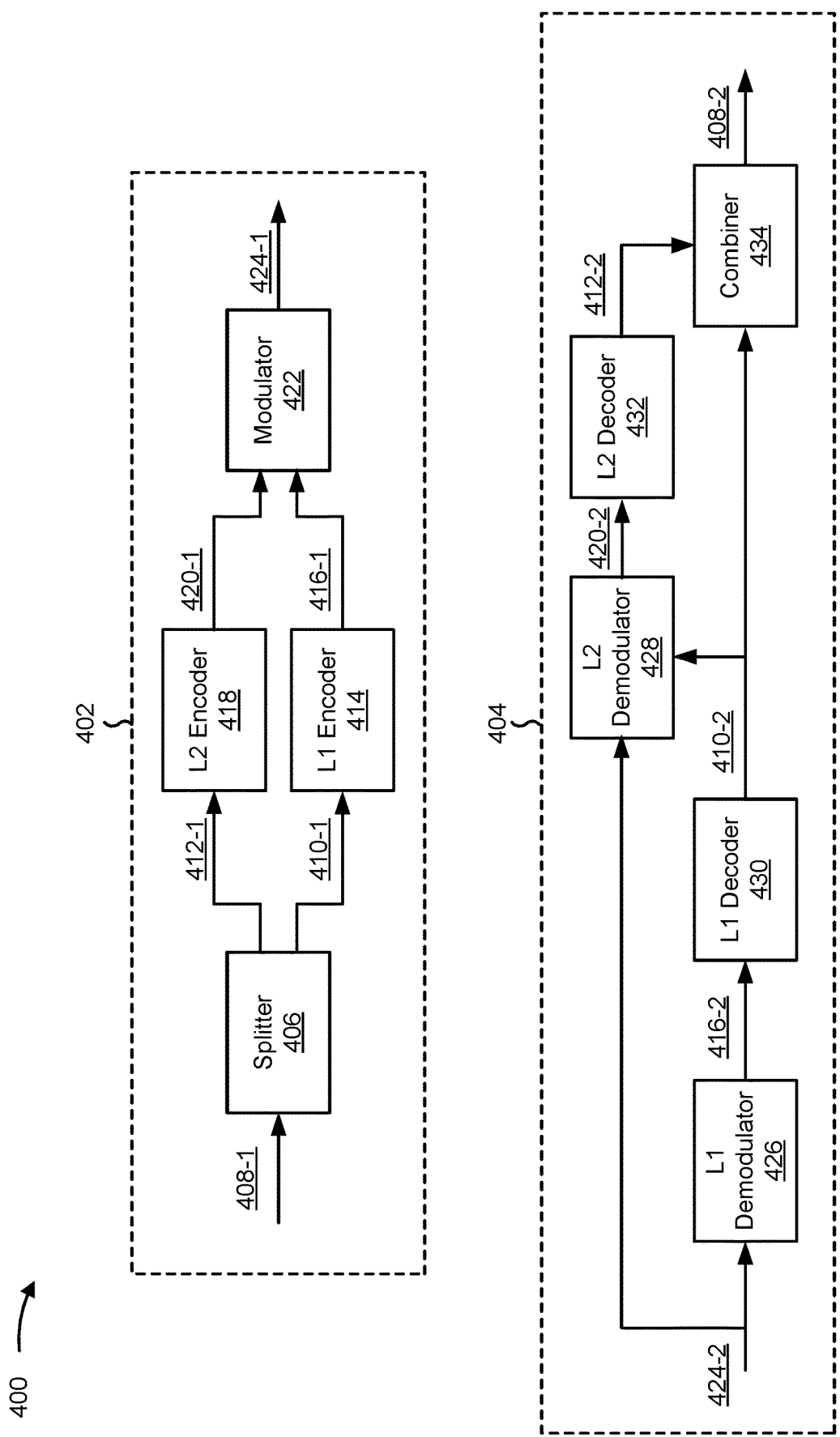
FIG. 4 is a diagram illustrating an example of a first block diagram of bit encoding that may be implemented in a transmitter and a second block diagram of bit decoding that may be implemented in a receiver, in accordance with the present disclosure.

FIG. 4 is a diagram illustrating an example 400 of a first block diagram 402 of bit encoding that may be implemented in a transmitter and a second block diagram 404 of bit decoding that may be implemented in a receiver, in accordance with the present disclosure.

The first block diagram 402 may represent a multi-level encoder that encodes data based at least in part on a first encoding algorithm associated with encoding one or more level 1 bits and a second encoding algorithm associated with encoding one or more level 2 bits. To illustrate, a splitter 406 may receive one or more bits 408-1 and partition the bits into one or more level 1 bits 410-1 (L1 bits 410-1) and one or more level 2 bits 412-1 (L2 bits 412-1). The splitter 406 may partition the one or more bits 408-1 based at least in part on any splitting ratio. To illustrate, the splitter 406 may receive K bits (e.g., in parallel or serially) and use a splitting ratio M:N to split the bits into M L1 bits and N L2 bits, where K, M, and N are integers and M+N=K. As one example, the splitter 406 may split the M most significant bits of the K bits into the L1 bits 410-1 and the N least significant bits of the K bits into the L2 bits 412-1 (or vice versa). The splitter 406 may split and/or group the K bits using any splitting ratio, such as a first splitting ratio where M=N, a second splitting ration where M>N, and/or a third splitting ratio where M<N. In some aspects, the splitter 406 may be configurable to dynamically change the splitting ratio. For example, a transmitter device may modify the splitting ratio used by the splitter 406 based at least in part on reducing power consumption of an encoder or decoder, such as by directing the splitter 406 to use a splitting ration that groups and/or directs more bits to an encoder that consumes less power relative to another encoder associated with multi-level coding In some aspects, a level 1 encoder 414 (L1 encoder 414) may receive the L1 bit(s) 410-1 as input and generate one or more level 1 encoded bits 416-1 (L1 encoded bits 416-1) based at least in part on a first encoding algorithm (e.g., an LDPC encoding algorithm). To illustrate, the L1 encoder 414 may receive the M L1 bits 410-1 from the splitter and generate X L1 encoded bits 416-1, where X is an integer that may be equal to, greater than, or less than M. A level 2 encoder 418 (L2 encoder 418) may receive the L2 bit(s) 412-1 as input and generate one or more level 2 encoded bits 420-1 (L2 encoded bits 420-1) based at least in part on a second encoding algorithm. For example, the L2 encoder 418 may receive N L2 bits 412-1 and generate Y L2 encoded bits 416-1, where Y is an integer that may be equal to, greater than, or less than N. The second encoding algorithm utilized by the L2 encoder 418 may be a different encoding algorithm (e.g., a Reed-Solomon encoding algorithm) than the first encoding algorithm. However, in some examples of multi-level coding, an L1 encoder may use a single encoding algorithm with a first configuration and an L2 encoder may use the single encoding algorithm with a second, different configuration. Some example configuration parameters associated with encoding and/or decoding may include a number of bits associated with puncturing (e.g., eliminating at) an encoder output, a shortening factor that indicates a number of zero bits to input to an encoder, a number of information bits in a set of bits, and/or a codeword length that indicates a total number of bits in the set.

In some aspects, the L2 encoder 418 may be configured to dynamically switch between encoding algorithms. For example, a transmitter device may initially configure the L2 encoder to utilize an LDPC encoding algorithm and subsequently configure the L2 encoder to switch to utilizing a Reed-Solomon encoding algorithm. Thus, in some examples, a transmitter may use a same encoder module (e.g., hardware, software, and/or firmware) that is configured to switch between encoding algorithms. Alternatively, the L2 encoder 418 may represent multiple encoder modules, where each encoder module implements an encoding algorithm and switching between encoding algorithms may include switching different encoder modules into (and out of) the processing path illustrated by the block diagram 402. By switching from the LDPC encoding algorithm to the Reed-Solomon encoding algorithm, the L2 encoder 418 may reduce an associated power consumption by the L2 encoder 418. Alternatively or additionally, modifying a splitting ratio utilized by the splitter 406 may reduce an associated power consumption by the first block diagram 402 by directing more bits to the L2 encoder 418 (e.g., associated with less power consumption) and less bits to the L1 encoder 414 (e.g., associated with more power consumption).

In a similar manner as described with regard to the modulator 312 of FIG. 3, a modulator 422 may receive the L1 encoded bits 416-1 and the L2 encoded bits 420-1 as input and generate a modulated signal 424-1. As one example, the modulator 422 may be based at least in part on a QAM modulator that generates I/Q coefficients associated with mapping the encoded bits to a constellation. To illustrate, the QAM modulator may receive the X L1 encoded bits 416-1 and the Y L2 encoded bits 420-2, and map the combined bits to a symbol on an (X+Y) QAM constellation, such as by using the X L1 encoded bits as the most significant bits of the symbol and the Y L2 encoded bits as the least significant bits of the symbol (or vice versa). The splitter 406, the L1 encoder 414, the L2 encoder 418, and/or the modulator 422 may be implemented using any combination of software, hardware, and/or firmware.

As shown by the second block diagram 404, a level 1 demodulator 426 (L1 demodulator 426) and a level 2 demodulator 428 (L2 demodulator 428) may receive a modulated signal 424-2 that may include distortion relative to the modulated signal 424-1. In a similar manner as described with regard to the demodulator 316, the L1 demodulator 426 may recover one or more level 1 encoded bits 416-2 (L1 encoded bits 416-2) based at least in part on processing the modulated signal 424-2. As one example, the L1 demodulator 426 may recover X L1 encoded bits 416-2. In some aspects, one or more values of the L1 encoded bits 416-2 may vary from one or more values of the L1 encoded bits 416-1 based at least in part on distortion included in the modulated signal 424-2. A level 1 decoder 430 (L1 decoder 430) may receive the L1 bits 416-2 and recover one or more level 1 bits 410-2 (L1 bits 410-2) based at least in part on a first decoding algorithm that is complementary to the first encoding algorithm utilized by the L1 encoder 414. To illustrate, the L1 decoder 430 may receive the X L1 encoded bits 416-2 and recover M L1 bits 410-2.

The L2 demodulator 428 may receive, in addition to the modulated signal 424-2, the L1 bits 410-2 and/or demodulation generated by the L1 decoder 430, and the L2 demodulator 428 may recover one or more level 2 encoded bits 420-2 (L2 encoded bits 420-2) based at least in part on the L1 bits 410-2. To illustrate, the L1 demodulator 426 and the L2 demodulator 428 may be based at least in part on a QAM demodulator that recovers encoded bits by estimating points on a corresponding constellation map. In some aspects, the L2 demodulator 428 may use the L1 bits 410 to identify a sub-constellation (e.g., a portion of a constellation map utilized by the L1 demodulator 426) as further described with regard to FIG. 5, and recover the L2 encoded bits 420-2 based at least in part on the sub-constellation. Alternatively or additionally, the L2 demodulator 428 may recover Y L2 encoded bits 420-2, where one or more value of the L2 encoded bits 420-2 vary from one or more values of the L2 encoded bits 420-1 based at least in part on distortion in the modulated signal 424-2.

In some aspects, a level 2 decoder 432 (L2 decoder 432) may receive the L2 encoded bits 420-2 as input and recover one or more level 2 bits 412-2 (L2 bits 412-2) based at least in part on a second decoding algorithm that is complementary to the second encoding algorithm utilized by the L2 encoder 418. As one example, the L2 decoder 432 may recover N L2 bits 412-2. In some aspects, the second decoding algorithm utilized by the L2 decoder 432 may be based at least in part on a Reed-Solomon encoding algorithm.

In a similar manner as described with regard to the L2 encoder 418, the L2 decoder 432 may be configured to dynamically switch between decoding algorithms. For example, a receiver device may initially configure the L2 decoder 432 to first utilize the first decoding algorithm that is based at least in part on the LDPC encoding algorithm and subsequently configure the L2 decoder 432 to switch to utilizing the second decoding algorithm that is based at least in part on the Reed-Solomon encoding algorithm. By switching from the first decoding algorithm to the second decoding algorithm, the L2 decoder 432 may reduce an associated power consumption by the L2 decoder 432 (e.g., by switching to a less complex decoding algorithm relative to the first decoding algorithm). A receiver device may initially configure the L2 decoder 432 to decode bits based at least in part on an LDPC encoding algorithm and subsequently configure the L2 decoder to switch and decode bits based at least in part on a Reed-Solomon encoding algorithm. Thus, in some examples, a receiver may use a same decoder module (e.g., hardware, software, and/or firmware) that is configured to decode bits based at least in part on switching between encoding algorithms. Alternatively, the L2 decoder 432 may represent multiple decoder modules, where each decoder module implements a decoding algorithm, and switching between decoding algorithms may include switching different decoder modules into (and out of) the processing path illustrated by the block diagram 404.

As shown by the second block diagram 404, a combiner 434 may receive and combine the L1 bits 410-2 and the L2 bits 412-2 to generate one or more bits 408-2. As one example, the combiner 434 may form a data unit based at least in part on using the L1 bits 410-2 as the most significant bits of the data unit and the L2 bits 412-2 as the least significant bits of the data unit (or vice versa). To illustrate, and complementary to that described with regard to the splitter 406, for a data unit that includes K bits, the combiner 434 may position the L1 bits 410-2 in the M most significant bits of the data unit and the L2 bits 412-2 in the N least significant bits of the data unit. The combiner 434 may output the (ordered) bits 408-2 serially or in parallel. The L1 demodulator 426, the L2 demodulator 428, the L1 decoder 430, the L2 decoder 432, and/or the combiner 434 may be implemented based at least in part on any combination of hardware, firmware, and/or software.

Utilizing multi-level encoding and/or decoding may enable a network entity to reduce power consumption in a wireless network relative to single-level encoding and/or decoding. A network entity may dynamically configure and/or reconfigure an L2 encoder and complementary L2 decoder based at least in part on identifying a channel condition in which a more complex encoding algorithm provides the same and/or commensurate (e.g., within a threshold value and/or within a range) protection against bit errors relative to a less complex encoding algorithm. For at least some channel conditions, encoders and/or decoders that utilize a less complex encoding algorithm may provide commensurate capacity relative to a more complex encoding algorithm with reduced power consumption.

As indicated above, FIG. 4 is provided as an example. Other examples may differ from what is described with regard to FIG. 4.

Figure 5:
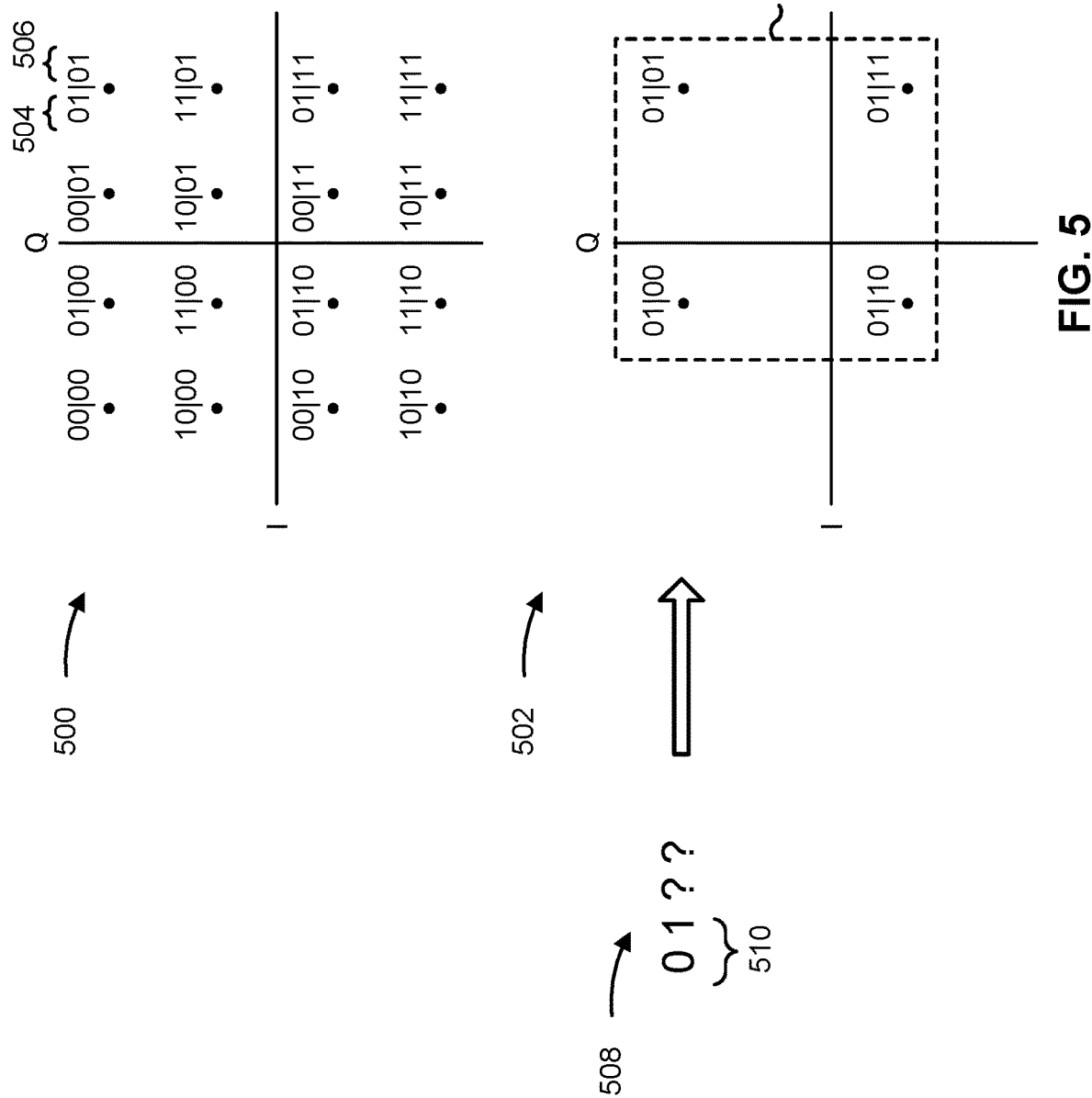
FIG. 5 is a diagram illustrating a first example of a constellation diagram and a second example of a sub-constellation diagram, in accordance with the present disclosure.

FIG. 5 is a diagram illustrating a first example 500 of a constellation diagram and a second example 502 of a sub-constellation diagram, in accordance with the present disclosure.

A constellation diagram is a representation of a signal modulated by a digital modulation scheme, such as binary phase shift keying (BPSK), π/2 BPSK, quadrature phase shift keying (QPSK), and/or quadrature amplitude modulation (QAM) (such as 16 QAM, 64 QAM, 128 QAM, and/or 256 QAM). A constellation diagram illustrates a signal as a two-dimensional scatter diagram with an x axis (e.g., a horizontal real axis representing an in-phase carrier, shown as an I component) and a y axis (e.g., a vertical imaginary axis representing a quadrature carrier, shown as a Q component). The angle of a constellation point, measured counterclockwise from the horizontal axis, represents a phase shift of a carrier wave from a reference phase. The distance to a constellation point, measured from the origin, represents the amplitude or power of the signal.

In a digital modulation system, information is transmitted as a series of samples, where each sample occupies a respective time period. During each sample, the carrier wave has a constant amplitude and phase value that is restricted to one of a finite number of values. Thus, each sample encodes one of a finite number of symbols, which in turn represents one or more binary digits (bits) of information. Each symbol is encoded as a combination of amplitude and phase of the carrier, and each symbol is represented by a point on the constellation diagram, called a constellation point. The constellation diagram shows all the possible symbols that can be transmitted by the system as a collection of points.

During demodulation, a demodulator identifies a constellation point with a highest likelihood of corresponding to a received signal (e.g., a received sample) and recovers binary digits based at least in part on the symbol associated with the identified constellation point.

To illustrate, the example 500 depicts an example constellation diagram for 16 QAM, where each symbol may be associated with a unique 4-bit pattern. A first symbol on the constellation diagram has an association with the bit pattern "0000" (e.g. as shown above the constellation point), a second symbol on the constellation diagram has an association with the bit pattern "0001", and so forth, up to a sixteenth symbol that has an association with the bit pattern "1111". The mappings of symbols to bit patterns as shown by the example 500 illustrate an example multi-level coding (MLC) bit mapping that is based at least in part on representing L1 bits as the two left-most bits (e.g. most significant bits) of a symbol (e.g., shown by bits 504) and representing L2 bits as the two right-most bits (e.g., least significant bits) of the symbol (e.g., shown by bits 506). However, other examples may include bit mappings that are based at least in part on representing the L1 bits as the least significant bits and the L2 bits as the most significant bits.

In some aspects, an MLC bit mapping separates constellation points with same L1 bits by a maximal Euclidean distance on a constellation diagram. For example, a first constellation point associated with an L1 bit pattern of "01" may be separated by a second constellation point associated with the L1 bit pattern of "01" by a maximal Euclidean distance. Separating the constellation points by the maximal Euclidean distance may reduce recovery errors when a demodulator recovers the L2 bits relative to shorter Euclidean distances as further described below. To illustrate, separating the symbols by a maximal Euclidean distance may increase a decision threshold between constellation points, which allows a signal to deviate more from the ideal values of the constellation point and increase a probability that a demodulator will correctly recover the bits. While the example 500 shows a bit mapping that is based at least in part on MLC bit mapping, other examples may assign different bit patterns to different symbols than those shown by the example 500.

In multi-level decoding, such as that described with regard to FIG. 4, a receiver may use a first demodulator (e.g., the L1 demodulator 426) to recover a first portion of encoded bits (e.g., the L1 encoded bits 416-2) and a second demodulator (e.g., the L2 demodulator 428) to recover a second portion of the encoded bits (e.g., the L2 encoded bits 420-2). To illustrate, bits 508 may represent a portion of recovered encoded bits that are based at least in part on 16 QAM. In some aspects, the L1 demodulator 426 may recover bits 510 of the bits 508. In some aspects, the L2 demodulator 428 may be configured to recover the unknown bits of the bits 508, denoted through the use of a "?". In some aspects, the L2 demodulator 428 may recover the unknown bits based at least in part on the known bits 510 recovered by the L1 demodulator 426.

To further illustrate, the L2 demodulator 428 may identify a sub-constellation diagram 512 based at least in part on identifying constellation points associated with an L1 bit mapping that corresponds to the bits 510 and demodulate the unknown bits based at least in part on the sub-constellation diagram 512. As shown by the sub-constellation diagram 512, each constellation point may have a same bit pattern as the bits 510 (e.g., "01") in the most significant bit position. In other examples, a sub-constellation diagram may be based at least in part on using the recovered bits as the least significant bits of a symbol, bits within center positions of the symbol, or other bit positions. Further, a sub-constellation diagram may include a symbol from each quadrant, symbols from a single quadrant, or symbols from a portion of the quadrants. Based at least in part on identifying the sub-constellation diagram 512, the L2 demodulator 428 may recover bits by determining which constellation point, of the sub-constellation, has a highest likelihood of corresponding to a received signal and recover bits based at least in part on an associated mapping to a bit pattern.

As indicated above, FIG. 5 is provided as an example. Other examples may differ from what is described with regard to FIG. 5.

Figure 6:
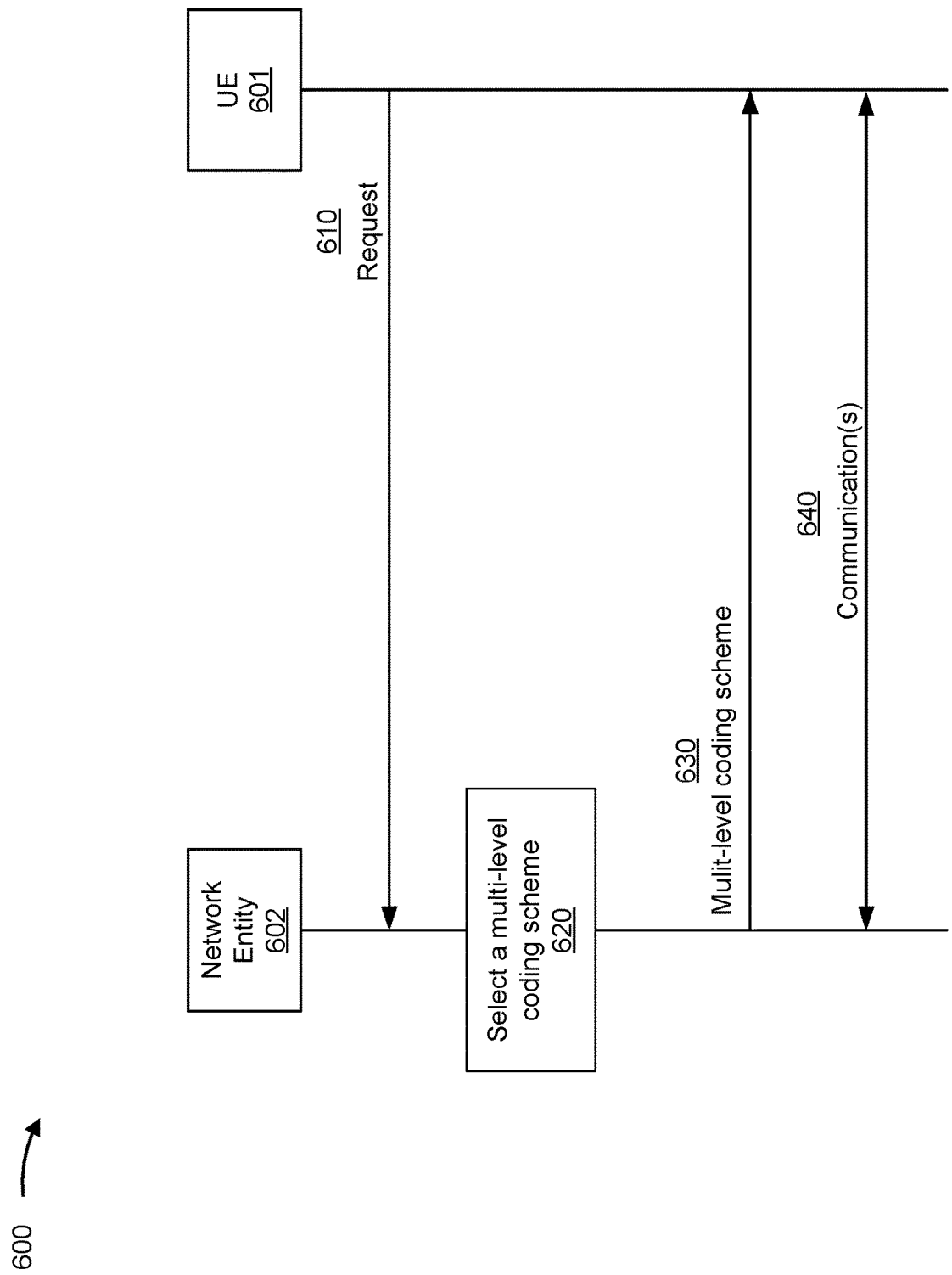
FIG. 6 illustrates an example of a wireless communication process between a UE and a network entity in a wireless communication network, in accordance with the present disclosure.

FIG. 6 illustrates an example 600 of a wireless communication process between a UE 601 (e.g., a UE 120 or an apparatus 1100) and a network entity 602 (e.g., a base station 110 or an apparatus 1000) in a wireless communication network, in accordance with the present disclosure.

As shown by reference number 610, a UE 601 may transmit, and a network entity 602 may receive, a request associated with reducing power consumption. To illustrate, the UE 601 may transmit the request using a radio resource control (RRC) message, a medium access control (MAC) control element (CE), uplink control information (UCI), and/or uplink signaling. In some aspects, the UE 601 may transmit the request explicitly, such as by transmitting an RRC message and/or a bit that is explicitly associated with requesting to reduce power consumption. Alternatively or additionally, the UE 601 may transmit the request implicitly, such as by transmitting a battery metric that indicates a charge level and/or a battery life that is below an acceptable threshold. As another example, the UE 601 may transmit a signal metric (e.g., SNR or RSRP) that indicates that a low-complexity encoding algorithm may provide commensurate performance to that provided by a high-complexity encoding algorithm.

In some aspects, the UE 601 may transmit, and the network entity 602 may receive, the request based at least in part on an encoder/decoder associated with a single encoding algorithm, such as a single-level encoder/decoder as described with regard to FIG. 3, or a multi-level encoder/decoder that uses a single encoding algorithm for all levels (e.g., using a first configuration for a first level and a second configuration for the second level). For example, the UE 601 may communicate the request to the network entity 602 based at least in part on the single encoding algorithm.

As shown by reference number 620, the network entity 602 may select a multi-level coding scheme based at least in part on power management (e.g., reducing power consumption in the wireless network). To illustrate, the network entity 602 may select a multi-level coding scheme that is based at least in part on a first encoding algorithm (e.g., an LDPC encoding algorithm) for a first level of coding and a second encoding algorithm (e.g., a Reed-Solomon encoding algorithm) for a second level of coding.

The network entity 602 may select a multi-level coding scheme based at least in part on reducing power consumption at the UE. For example, an encoder and/or a decoder at the UE that encodes and/or decodes bits based at least in part on the first encoding algorithm may consume power at a first rate. The network entity 602 may select the second encoding algorithm based at least in part on a second power consumption associated with an encoder and/or decoder that encodes and/or decodes bits based at least in part on the second encoding algorithm, where the second power consumption is lower than a first power consumption associated with the first encoding algorithm.

In some aspects, the network entity 602 may select, as part of the multi-level coding scheme, a first code rate associated with level 1 coding (e.g., a first code rate associated with a first configuration of the first encoding algorithm) and a second code rate associated with level 2 coding (e.g., a second code rate associated with a second configuration of the second encoding algorithm), where the second code rate is higher than the first code rate. A "weak" code rate and/or encoding algorithm may denote an encoding algorithm configured with less redundancy relative to a "strong" code rate and/or encoding algorithm. A "strong" code rate may denote an encoding algorithm configured with more redundancy. The redundancy utilized by an encoding algorithm may be proportional to bit error correction abilities by the encoding algorithm. To illustrate, a weak encoding algorithm may have less ability to correct bit errors relative to a strong encoding algorithm based at least in part on having less redundancy to use for bit error correction. For a set of bits, a "code rate" may denote a ratio between information bits included in the set and a total number of bits in the set. Fewer information bits in the set may correspond to more redundant bits in the set. A first code rate closer to 0 may be associated with a first, stronger encoding algorithm relative to a second, weaker encoding algorithm associated with a second code rate closer to 1. In some aspects, a code rate may be defined and/or provide an indication of how weak or strong an encoding algorithm is based at least in part on a threshold. A code rate associated with an encoder/decoder may be configurable based at least in part on one or more of: a number of bits associated with puncturing (e.g., eliminating at) an encoder output, a shortening factor that indicates a number of zero bits to input to an encoder, a number of information bits in a set of bits, and/or a codeword length that indicates a total number of bits in the set.

In some aspects, the network entity 602 may select, as part of the multi-level coding scheme, a bit ratio associated with partitioning a number of bits between the level 1 coding and the level 2 coding, as further described with regard to FIG. 4. The network entity 602 may select the bit ratio and/or partitioning based at least in part on reducing power consumption, such as by selecting a bit ratio that directs more bits to a level 2 encoder/decoder associated with less power consumption relative to bits directed to a level 1 encoder/decoder.

The network entity 602 may select the multi-level coding scheme based at least in part on a modulation and coding scheme (MCS) table that specifies and/or includes the multi-level coding scheme. For example, the MCS table may include one or more multi-level coding schemes that are associated with multiple encoding algorithms (e.g., a first encoding algorithm associated with level 1 coding and a second encoding algorithm associated with level 2 coding). Alternatively or additionally, the MCS table may specify, for each entry in the MCS table, configuration information for each encoding algorithm associated with the entry. The network entity 602 may select, as the multi-level coding scheme, an entry from the MCS table associated with reducing power consumption relative to a current coding scheme used for communications.

In some aspects, the network entity 602 may initially communicate with the UE 601 based at least in part on a multi-level coding scheme that utilizes a single encoding algorithm (e.g., a first configuration of the single encoding algorithm for L1 coding and a second configuration of the single encoding algorithm for L2 coding). While communicating with the UE based at least in part on the single encoding algorithm, the network entity 602 may identify that the second configuration of the single encoding algorithm for the L2 coding may be associated with a code rate that satisfies a weak threshold. To illustrate, the code rate may satisfy a weak threshold defined as 0.9. The network entity 602 may determine to switch the L2 encoding algorithm to a second, different encoding algorithm associated with less power consumption at an encoder/decoder.

As shown by reference number 630, the network entity 602 may transmit, and the UE 601 may receive, an indication of the multi-level coding scheme. As one example, the network entity 602 may transmit an index that maps to an entry in the MCS table. The network entity 602 may transmit the indication using one or more of an RRC message, a MAC CE, and/or downlink control information (DCI).

As shown by reference number 640, the network entity 602 and the UE 601 may communicate based at least in part on the multi-level coding scheme associated with at least two encoding algorithms. To illustrate, the network entity 602 and/or the UE 601 may reconfigure an L2 encoder and/or an L2 decoder to utilize a different encoding algorithm relative to an L1 encoder and/or an L1 decoder. Accordingly, in some aspects, the network entity 602 and the UE 601 may initially communicate with one another based at least in part on a single encoding algorithm, and then dynamically switch to communicating with one another based at least in part on a multi-level coding scheme associated with multiple, different encoding algorithms.

As further described above, a network entity may reduce power consumption in a wireless network based at least in part on dynamically switching the UE and/or the network entity from using a single encoding algorithm to multiple encoding algorithms. Reducing power consumption may extend a battery life of a UE and extend a lifespan of connectivity to the wireless network.

As indicated above, FIG. 6 is provided as an example. Other examples may differ from what is described with regard to FIG. 6.

Figure 7:
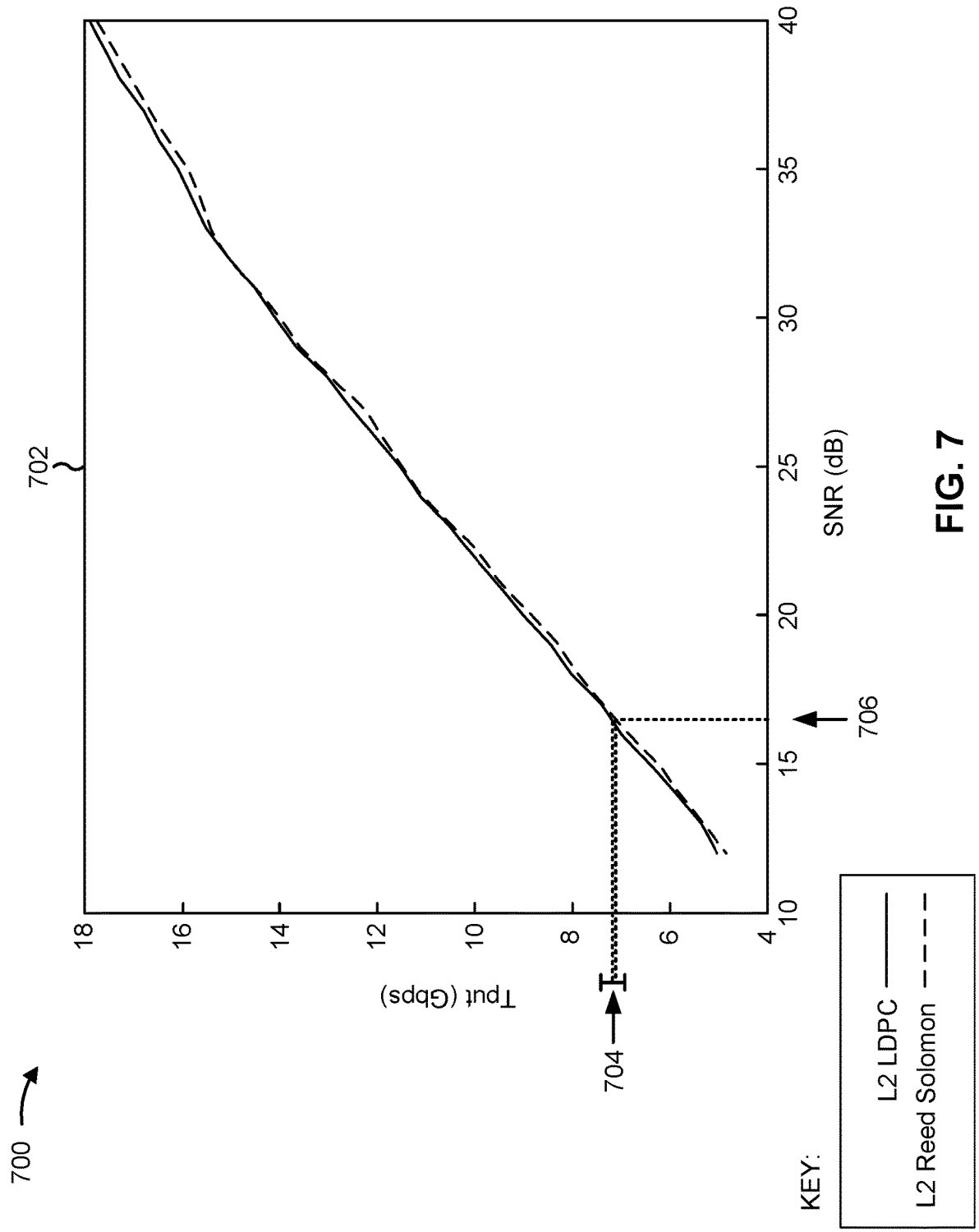
FIG. 7 illustrates an example of commensurate performance of a first encoding algorithm and a second encoding algorithm, in accordance with the present disclosure.

FIG. 7 illustrates an example 700 of commensurate performance of a first encoding algorithm and a second encoding algorithm, in accordance with the present disclosure.

The example 700 includes a graph 702 that compares a first performance (e.g., capacity) of a first encoding algorithm (e.g., LDPC) to a second performance of a second encoding algorithm (e.g., Reed-Solomon). A horizontal axis of the graph 702 represents an SNR metric associated with a communication channel condition, where the SNR metric has a unit of decibels (dB). A vertical axis of the graph 702 represents a throughput (e.g., capacity) metric that has a unit of Gigabits per second (Gbps). The graph 702 illustrates the first performance of the first encoding algorithm through the use of a solid line and the second performance of the second encoding algorithm through the use of a dashed line.

Range 704 illustrates an example range of values and/or thresholds that may be used to define "commensurate" performance between the first encoding algorithm and the second encoding algorithm. At channel condition 706, a first performance associated with the first encoding algorithm and a second performance associated with the second encoding algorithm are within the range 704 of one another. Accordingly, a network entity may determine to dynamically switch L2 coding from the first encoding algorithm to the second encoding algorithm based at least in part on identifying the commensurate performance at the channel condition 706.

As indicated above, FIG. 7 is provided as an example. Other examples may differ from what is described with regard to FIG. 7.

Figure 8:
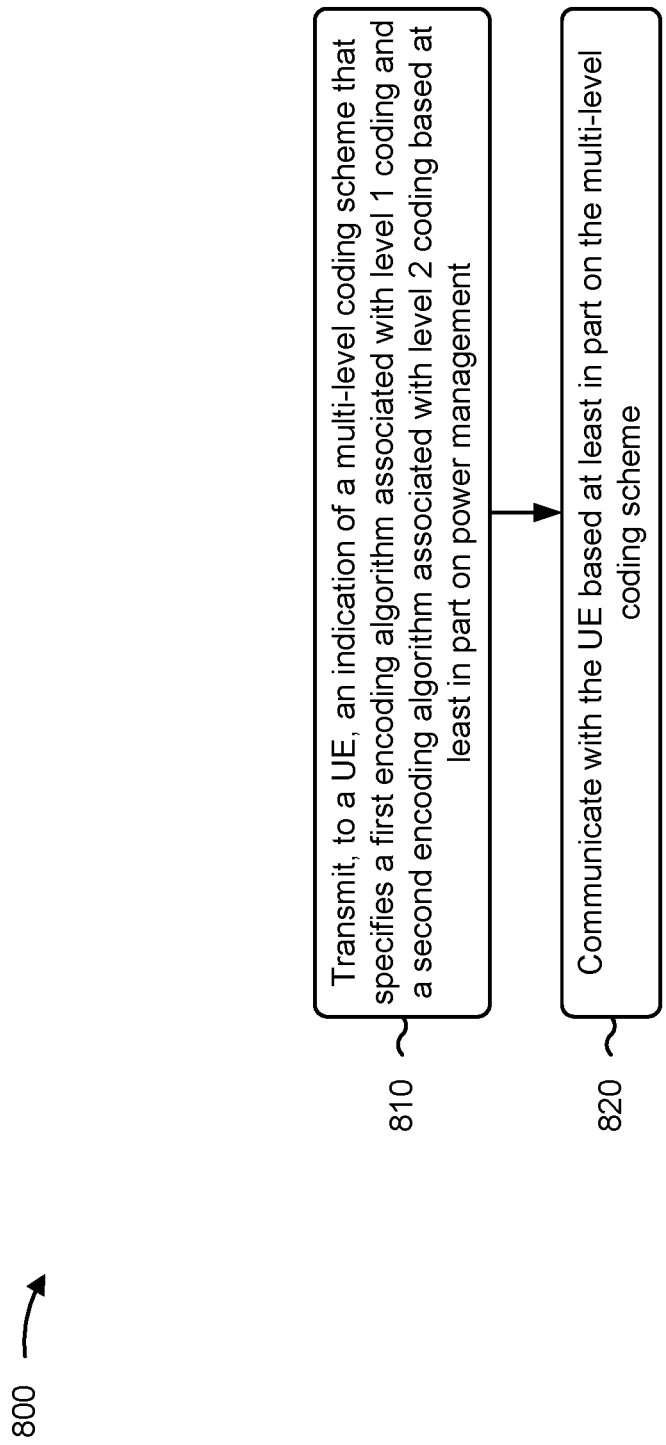
FIG. 8 is a diagram illustrating an example process performed, for example, by a network entity, in accordance with the present disclosure.

FIG. 8 is a diagram illustrating an example process 800 performed, for example, by a network entity, in accordance with the present disclosure. Example process 800 is an example where the network entity (e.g., a base station 110, a network entity 602, or an apparatus 1000) performs operations associated with adaptive multi-level coding based on power management.

As shown in FIG. 8, in some aspects, process 800 may include transmitting, to a UE, an indication of a multi-level coding scheme that specifies a first encoding algorithm associated with level 1 coding and a second encoding algorithm associated with level 2 coding based at least in part on power management (block 810). For example, the network entity (e.g., using communication manager 150 and/or transmission component 1004, depicted in FIG. 10) may transmit, to a UE, an indication of a multi-level coding scheme that specifies a first encoding algorithm associated with level 1 coding and a second encoding algorithm associated with level 2 coding based at least in part on power management, as described above.

As further shown in FIG. 8, in some aspects, process 800 may include communicating with the UE based at least in part on the multi-level coding scheme (block 820). For example, the network entity (e.g., using communication manager 150, transmission component 1004 and/or reception component 1002, depicted in FIG. 10) may communicate with the UE based at least in part on the multi-level coding scheme, as described above.

Process 800 may include additional aspects, such as any single aspect or any combination of aspects described below and/or in connection with one or more other processes described elsewhere herein.

In a first aspect, process 800 includes selecting the first encoding algorithm and the second encoding algorithm for the multi-level coding scheme based at least in part on reducing power consumption by an encoder or a decoder.

In a second aspect, alone or in combination with the first aspect, process 800 includes selecting the first encoding algorithm and the second encoding algorithm based at least in part on reducing power consumption by the UE.

In a third aspect, alone or in combination with one or more of the first and second aspects, process 800 includes communicating, prior to transmitting the indication of the multi-level coding scheme, with the UE based at least in part on a coding scheme associated with a single encoding algorithm prior to transmitting the indication of the multi-level coding scheme, and switching from communicating with the UE based at least in part on the coding scheme associated with the single encoding algorithm to communicating with the UE based at least in part on the multi-level coding scheme.

In a fourth aspect, alone or in combination with one or more of the first through third aspects, the multi-level coding scheme indicates a first code rate associated with the level 1 coding, and a second code rate associated with the level 2 coding, wherein the second code rate is higher than the first code rate.

In a fifth aspect, alone or in combination with one or more of the first through fourth aspects, process 800 includes selecting the multi-level coding scheme based at least in part on a bit ratio associated with partitioning a number of bits between the level 1 coding and the level 2 coding.

In a sixth aspect, alone or in combination with one or more of the first through fifth aspects, the first encoding algorithm is based at least in part on a low-density parity-check encoding algorithm, and the second encoding algorithm is based at least in part on a Reed-Solomon encoding algorithm.

In a seventh aspect, alone or in combination with one or more of the first through sixth aspects, the first encoding algorithm is associated with a first power consumption by a first encoder or a first decoder, wherein the second encoding algorithm is associated with a second power consumption by a second encoder or a second decoder, and wherein the second power consumption is lower than the first power consumption.

In an eighth aspect, alone or in combination with one or more of the first through seventh aspects, the first encoder and the second encoder are a same encoder that is configured to switch between the first encoding algorithm and the second encoding algorithm.

In a ninth aspect, alone or in combination with one or more of the first through eighth aspects, the first encoder and the second encoder are different encoder modules.

In a tenth aspect, alone or in combination with one or more of the first through ninth aspects, process 800 includes selecting the multi-level coding scheme based at least in part on an MCS table that includes the multi-level coding scheme.

In an eleventh aspect, alone or in combination with one or more of the first through tenth aspects, the indication specifies an index that maps to an entry in the MCS table associated with the multi-level coding scheme.

In a twelfth aspect, alone or in combination with one or more of the first through eleventh aspects, process 800 includes receiving a request from the UE associated with reducing power consumption by the UE, and selecting the multi-level coding scheme based at least in part on receiving the request.

In a thirteenth aspect, alone or in combination with one or more of the first through twelfth aspects, receiving the request further comprises receiving the request implicitly by receiving a battery metric from the UE.

In a fourteenth aspect, alone or in combination with one or more of the first through thirteenth aspects, the multi-level coding scheme that specifies the first encoding algorithm and the second encoding algorithm is a first multi-level coding scheme, and process 800 includes communicating with the UE based at least in part on a second multi-level coding scheme that specifies to use the first encoding algorithm in a first configuration for the level 1 coding and a second configuration for the level 2 coding, and switching from communicating with the UE based at least in part on the second multi-level coding scheme to communicating with the network entity based at least in part on the first multi-level coding scheme.

In a fifteenth aspect, alone or in combination with one or more of the first through fourteenth aspects, process 800 includes identifying, while communicating with the UE based at least in part on the second multi-level coding scheme, that a code rate associated with the level 2 coding satisfies a weak threshold, and determining to switch to the first multi-level coding scheme based at least in part on identifying that the code rate satisfies the weak threshold.

In a sixteenth aspect, alone or in combination with one or more of the first through fifteenth aspects, process 800 includes receiving a signal metric that indicates the first encoding algorithm and the second encoding algorithm provide performance within a threshold of one another, and determining to switch to the first multi-level coding scheme based at least in part on the signal metric.

Although FIG. 8 shows example blocks of process 800, in some aspects, process 800 may include additional blocks, fewer blocks, different blocks, or differently arranged blocks than those depicted in FIG. 8. Additionally, or alternatively, two or more of the blocks of process 800 may be performed in parallel.

Figure 9:
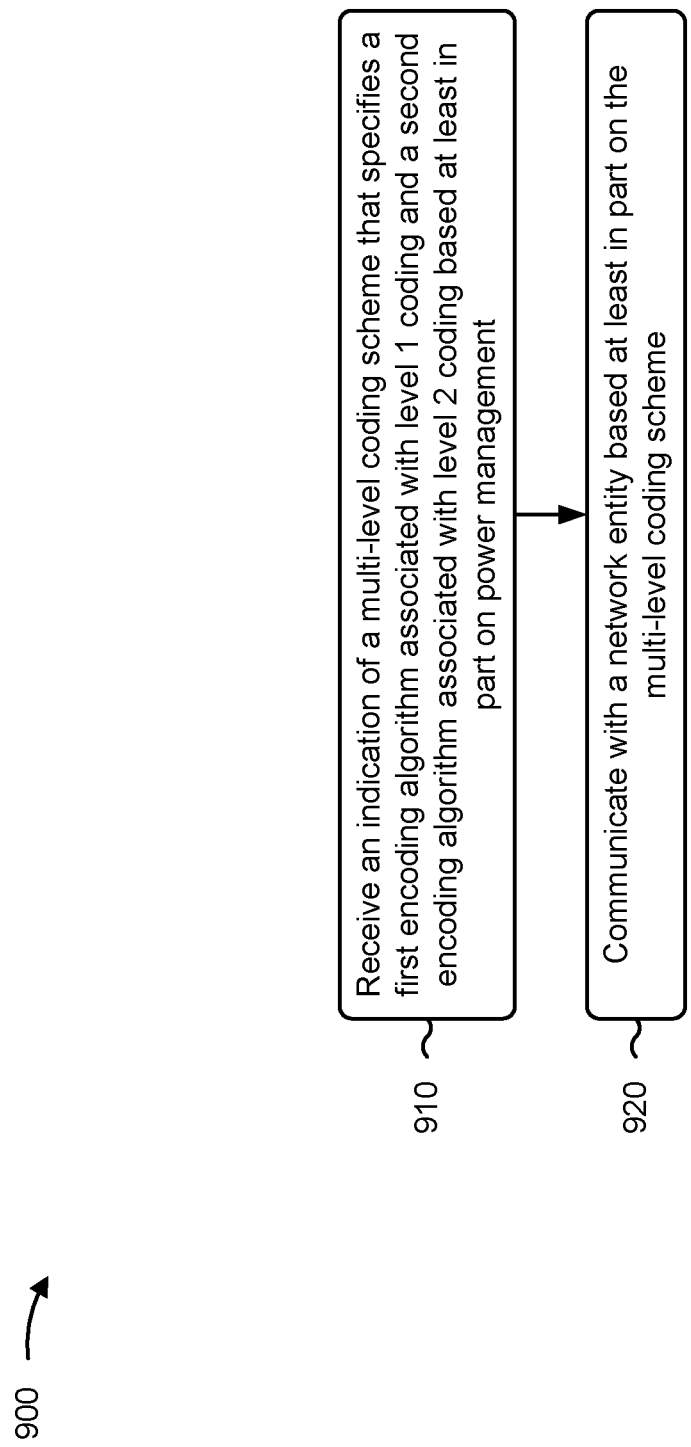
FIG. 9 is a diagram illustrating an example process performed, for example, by a UE, in accordance with the present disclosure.

FIG. 9 is a diagram illustrating an example process 900 performed, for example, by an UE, in accordance with the present disclosure. Example process 900 is an example where the UE (e.g., UE 120 or apparatus 1100) performs operations associated with adaptive multi-level coding based on power management.

As shown in FIG. 9, in some aspects, process 900 may include receiving an indication of a multi-level coding scheme that specifies a first encoding algorithm associated with level 1 coding and a second encoding algorithm associated with level 2 coding based at least in part on power management (block 910). For example, the UE (e.g., using communication manager 140 and/or reception component 1102, depicted in FIG. 11) may receive an indication of a multi-level coding scheme that specifies a first encoding algorithm associated with level 1 coding and a second encoding algorithm associated with level 2 coding based at least in part on power management, as described above.

As further shown in FIG. 9, in some aspects, process 900 may include communicating with a network entity based at least in part on the multi-level coding scheme (block 920). For example, the UE (e.g., using communication manager 140, reception component 1102 and/or transmission component 1104, depicted in FIG. 11) may communicate with a network entity based at least in part on the multi-level coding scheme, as described above.

Process 900 may include additional aspects, such as any single aspect or any combination of aspects described below and/or in connection with one or more other processes described elsewhere herein.

In a first aspect, the power management is based at least in part on reducing power consumption by an encoder or a decoder at the UE.

In a second aspect, alone or in combination with the first aspect, process 900 includes communicating, prior to receiving the indication of the multi-level coding scheme, with the network entity based at least in part on a coding scheme associated with a single encoding algorithm, and switching from communicating with the network entity based at least in part on the coding scheme associated with the single encoding algorithm to communicating with the network entity based at least in part on the multi-level coding scheme.

In a third aspect, alone or in combination with one or more of the first and second aspects, the multi-level coding scheme indicates a first code rate associated with the level 1 coding, and a second code rate associated with the level 2 coding, wherein the second code rate is higher than the first code rate.

In a fourth aspect, alone or in combination with one or more of the first through third aspects, the first encoding algorithm is based at least in part on a low-density parity-check encoding algorithm, and the second encoding algorithm is based at least in part on a Reed-Solomon encoding algorithm.

In a fifth aspect, alone or in combination with one or more of the first through fourth aspects, the first encoding algorithm is associated with a first power consumption by a first encoder or a first decoder, wherein the second encoding algorithm is associated with a second power consumption by a second encoder or a second decoder, and wherein the second power consumption is lower than the first power consumption.

In a sixth aspect, alone or in combination with one or more of the first through fifth aspects, the first encoder and the second encoder are a same encoder that is configured to switch between the first encoding algorithm and the second encoding algorithm.

In a seventh aspect, alone or in combination with one or more of the first through sixth aspects, the first encoder and the second encoder are different encoder modules.

In an eighth aspect, alone or in combination with one or more of the first through seventh aspects, the indication of the multi-level coding scheme is based at least in part on an MCS table that includes the multi-level coding scheme.

In a ninth aspect, alone or in combination with one or more of the first through eighth aspects, the indication specifies an index that maps to an entry in the MCS table associated with the multi-level coding scheme.

In a tenth aspect, alone or in combination with one or more of the first through ninth aspects, process 900 includes transmitting a request associated with reducing power consumption by the UE, wherein receiving the indication of a multi-level coding scheme is based at least in part on transmitting the request.

In an eleventh aspect, alone or in combination with one or more of the first through tenth aspects, transmitting the request further comprises transmitting the request implicitly by transmitting a battery metric associated with a battery at the UE.

In a twelfth aspect, alone or in combination with one or more of the first through eleventh aspects, the multi-level coding scheme that specifies the first encoding algorithm and the second encoding algorithm is a first multi-level coding scheme, and process 900 includes communicating with the network entity based at least in part on a second multi-level coding scheme that specifies to use the first encoding algorithm in a first configuration for the level 1 coding and a second configuration for the level 2 coding, and switching from communicating with the network entity based at least in part on the second multi-level coding scheme to communicating with the network entity based at least in part on the first multi-level coding scheme.

In a thirteenth aspect, alone or in combination with one or more of the first through twelfth aspects, process 900 includes transmitting a signal metric that indicates the first encoding algorithm and the second encoding algorithm provide performance within a threshold of one another, and receiving an indication to switch to the first multi-level coding scheme based at least in part on transmitting the signal metric.

Although FIG. 9 shows example blocks of process 900, in some aspects, process 900 may include additional blocks, fewer blocks, different blocks, or differently arranged blocks than those depicted in FIG. 9. Additionally, or alternatively, two or more of the blocks of process 900 may be performed in parallel.

Figure 10:
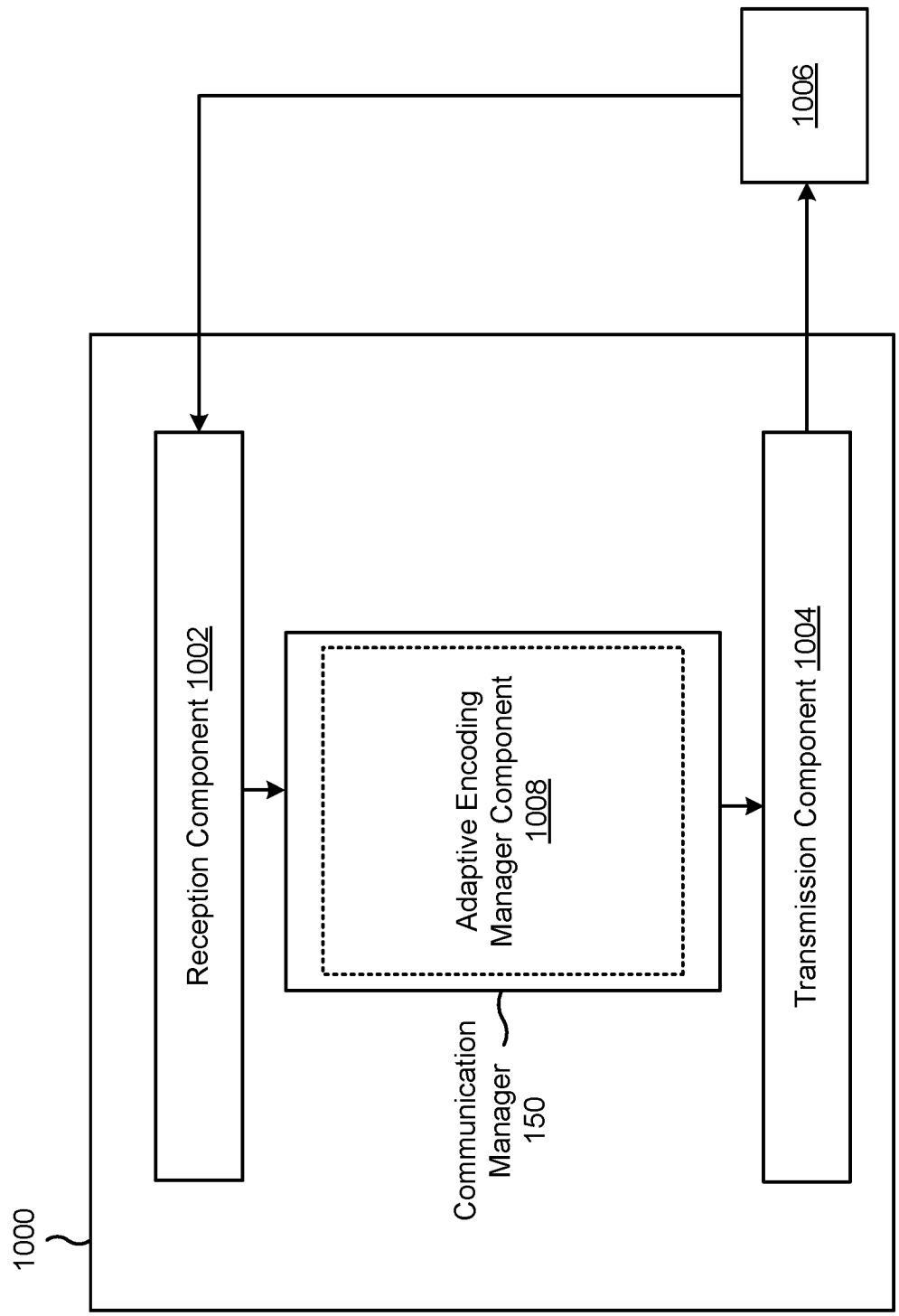
FIG. 10 is a diagram of an example apparatus for wireless communication, in accordance with the present disclosure.

FIG. 10 is a diagram of an example apparatus 1000 for wireless communication, in accordance with the present disclosure. The apparatus 1000 may be a network entity, or a network entity may include the apparatus 1000. In some aspects, the apparatus 1000 includes a reception component 1002 and a transmission component 1004, which may be in communication with one another (for example, via one or more buses and/or one or more other components). As shown, the apparatus 1000 may communicate with another apparatus 1006 (such as a UE, a base station, or another wireless communication device) using the reception component 1002 and the transmission component 1004. As further shown, the apparatus 1000 may include the communication manager 150. The communication manager 150 may include one or more of an adaptive encoding manager component 1008, among other examples.

In some aspects, the apparatus 1000 may be configured to perform one or more operations described herein in connection with FIGS. 3-9. Additionally, or alternatively, the apparatus 1000 may be configured to perform one or more processes described herein, such as process 800 of FIG. 8, or a combination thereof. In some aspects, the apparatus 1000 and/or one or more components shown in FIG. 10 may include one or more components of the network entity described in connection with FIG. 2. Additionally, or alternatively, one or more components shown in FIG. 10 may be implemented within one or more components described in connection with FIG. 2. Additionally, or alternatively, one or more components of the set of components may be implemented at least in part as software stored in a memory. For example, a component (or a portion of a component) may be implemented as instructions or code stored in a non-transitory computer-readable medium and executable by a controller or a processor to perform the functions or operations of the component.

The reception component 1002 may receive communications, such as reference signals, control information, data communications, or a combination thereof, from the apparatus 1006. The reception component 1002 may provide received communications to one or more other components of the apparatus 1000. In some aspects, the reception component 1002 may perform signal processing on the received communications (such as filtering, amplification, demodulation, analog-to-digital conversion, demultiplexing, deinterleaving, de-mapping, equalization, interference cancellation, or decoding, among other examples), and may provide the processed signals to the one or more other components of the apparatus 1000. In some aspects, the reception component 1002 may include one or more antennas, a modem, a demodulator, a MIMO detector, a receive processor, a controller/processor, a memory, or a combination thereof, of the network entity described in connection with FIG. 2.

The transmission component 1004 may transmit communications, such as reference signals, control information, data communications, or a combination thereof, to the apparatus 1006. In some aspects, one or more other components of the apparatus 1000 may generate communications and may provide the generated communications to the transmission component 1004 for transmission to the apparatus 1006. In some aspects, the transmission component 1004 may perform signal processing on the generated communications (such as filtering, amplification, modulation, digital-to-analog conversion, multiplexing, interleaving, mapping, or encoding, among other examples), and may transmit the processed signals to the apparatus 1006. In some aspects, the transmission component 1004 may include one or more antennas, a modem, a modulator, a transmit MIMO processor, a transmit processor, a controller/processor, a memory, or a combination thereof, of the network entity described in connection with FIG. 2. In some aspects, the transmission component 1004 may be co-located with the reception component 1002 in a transceiver.

The transmission component 1004 may transmit, to a UE, an indication of a multi-level coding scheme that specifies a first encoding algorithm associated with level 1 coding and a second encoding algorithm associated with level 2 coding based at least in part on power management. The communication manager 150 may communicate with the UE based at least in part on the multi-level coding scheme.

The adaptive encoding manager component 1008 may select the first encoding algorithm and the second encoding algorithm for the multi-level coding scheme based at least in part on reducing power consumption by an encoder or a decoder. As one example, the adaptive encoding manager component 1008 may select the first encoding algorithm and the second encoding algorithm based at least in part on reducing power consumption by the UE.

The communication manager 150 may communicate, prior to transmitting the indication of the multi-level coding scheme, with the UE based at least in part on a coding scheme associated with a single encoding algorithm prior to transmitting the indication of the multi-level coding scheme.

The adaptive encoding manager component 1008 may instruct the communication manager 150 to switch from communicating with the UE based at least in part on the coding scheme associated with the single encoding algorithm to communicating with the UE based at least in part on the multi-level coding scheme. The adaptive encoding manager component 1008 may select the multi-level coding scheme based at least in part on a bit ratio associated with partitioning a number of bits between the level 1 coding and the level 2 coding. In some aspects, the adaptive encoding manager component 1008 may select the multi-level coding scheme based at least in part on an MCS table that includes the multi-level coding scheme.

The reception component 1002 may receive a request from the UE associated with reducing power consumption by the UE. In some aspects, adaptive encoding manager component 1008 may select the multi-level coding scheme based at least in part on receiving the request.

The adaptive encoding manager component 1008 may identify, while communicating with the UE based at least in part on the second multi-level coding scheme, that a code rate associated with the level 2 coding satisfies a weak threshold. Based at least in part on identifying that the code rate satisfies the weak threshold, the adaptive encoding manager component 1008 may determine to switch to the first multi-level coding scheme based at least in part on identifying that the code rate satisfies the weak threshold.

The reception component 1002 may receive a signal metric that indicates the first encoding algorithm and the second encoding algorithm provide performance within a threshold of one another. Based at least in part on the reception component 1002 receiving the signal metric, the adaptive encoding manager component 1008 may determine to switch to the first multi-level coding scheme based at least in part on the signal metric.

The number and arrangement of components shown in FIG. 10 are provided as an example. In practice, there may be additional components, fewer components, different components, or differently arranged components than those shown in FIG. 10. Furthermore, two or more components shown in FIG. 10 may be implemented within a single component, or a single component shown in FIG. 10 may be implemented as multiple, distributed components. Additionally, or alternatively, a set of (one or more) components shown in FIG. 10 may perform one or more functions described as being performed by another set of components shown in FIG. 10.

Figure 11:
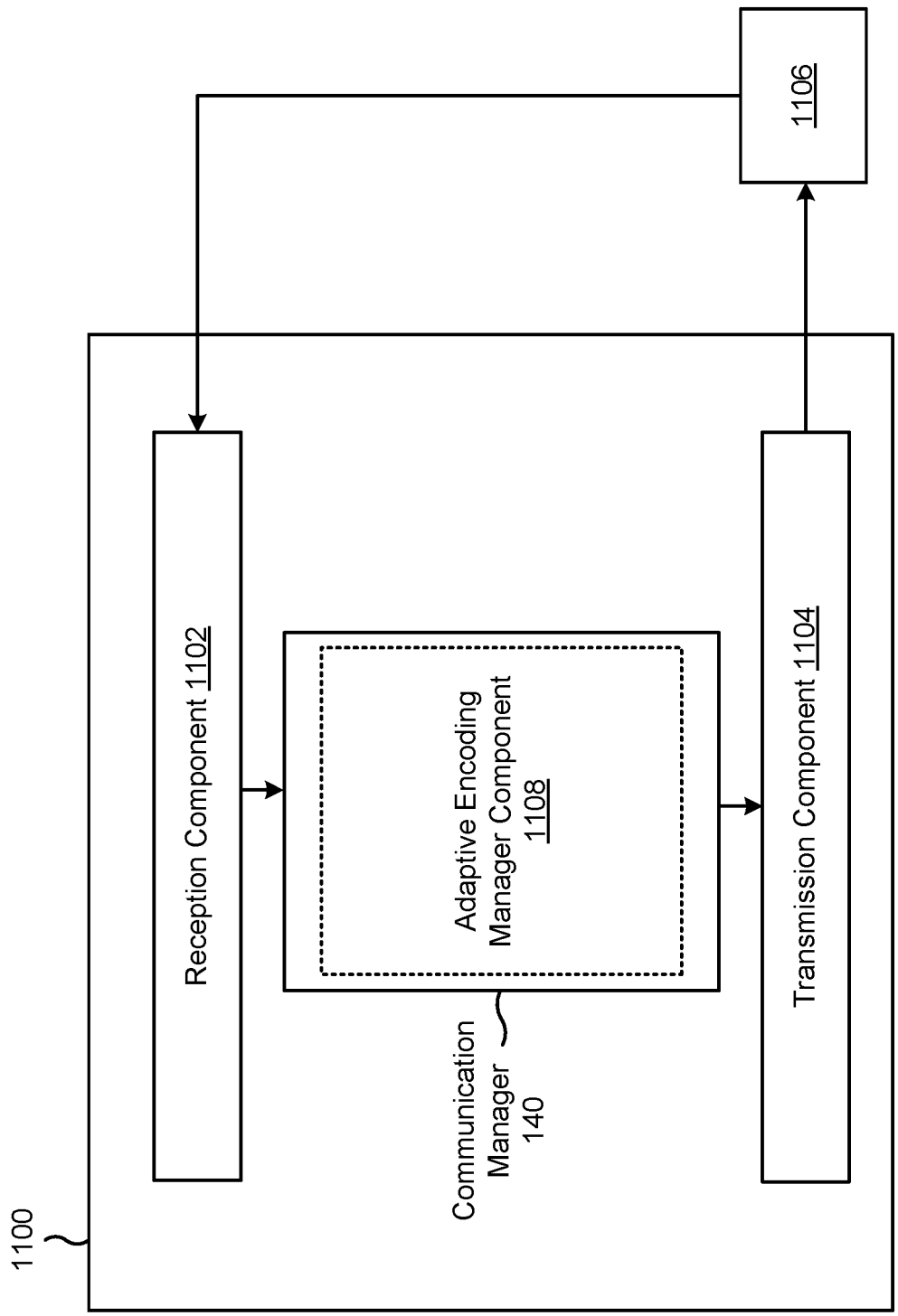
FIG. 11 is a diagram of an example apparatus for wireless communication, in accordance with the present disclosure.

FIG. 11 is a diagram of an example apparatus 1100 for wireless communication. The apparatus 1100 may be a UE, or a UE may include the apparatus 1100. In some aspects, the apparatus 1100 includes a reception component 1102 and a transmission component 1104, which may be in communication with one another (for example, via one or more buses and/or one or more other components). As shown, the apparatus 1100 may communicate with another apparatus 1106 (such as a UE, a base station, or another wireless communication device) using the reception component 1102 and the transmission component 1104. As further shown, the apparatus 1100 may include the communication manager 140. The communication manager 140 may include one or more of an adaptive encoding manager component 1108, among other examples.

In some aspects, the apparatus 1100 may be configured to perform one or more operations described herein in connection with FIGS. 3-9. Additionally, or alternatively, the apparatus 1100 may be configured to perform one or more processes described herein, such as process 900 of FIG. 9, or a combination thereof. In some aspects, the apparatus 1100 and/or one or more components shown in FIG. 11 may include one or more components of the UE described in connection with FIG. 2. Additionally, or alternatively, one or more components shown in FIG. 11 may be implemented within one or more components described in connection with FIG. 2. Additionally, or alternatively, one or more components of the set of components may be implemented at least in part as software stored in a memory. For example, a component (or a portion of a component) may be implemented as instructions or code stored in a non-transitory computer-readable medium and executable by a controller or a processor to perform the functions or operations of the component.

The reception component 1102 may receive communications, such as reference signals, control information, data communications, or a combination thereof, from the apparatus 1106. The reception component 1102 may provide received communications to one or more other components of the apparatus 1100. In some aspects, the reception component 1102 may perform signal processing on the received communications (such as filtering, amplification, demodulation, analog-to-digital conversion, demultiplexing, deinterleaving, de-mapping, equalization, interference cancellation, or decoding, among other examples), and may provide the processed signals to the one or more other components of the apparatus 1100. In some aspects, the reception component 1102 may include one or more antennas, a modem, a demodulator, a MIMO detector, a receive processor, a controller/processor, a memory, or a combination thereof, of the UE described in connection with FIG. 2.

The transmission component 1104 may transmit communications, such as reference signals, control information, data communications, or a combination thereof, to the apparatus 1106. In some aspects, one or more other components of the apparatus 1100 may generate communications and may provide the generated communications to the transmission component 1104 for transmission to the apparatus 1106. In some aspects, the transmission component 1104 may perform signal processing on the generated communications (such as filtering, amplification, modulation, digital-to-analog conversion, multiplexing, interleaving, mapping, or encoding, among other examples), and may transmit the processed signals to the apparatus 1106. In some aspects, the transmission component 1104 may include one or more antennas, a modem, a modulator, a transmit MIMO processor, a transmit processor, a controller/processor, a memory, or a combination thereof, of the UE described in connection with FIG. 2. In some aspects, the transmission component 1104 may be co-located with the reception component 1102 in a transceiver.

The reception component 1102 may receive an indication of a multi-level coding scheme that specifies a first encoding algorithm associated with level 1 coding and a second encoding algorithm associated with level 2 coding based at least in part on power management. The communication manager 140 may communicate with a network entity based at least in part on the multi-level coding scheme. In some aspects, the communication manager 140 may communicate, prior to receiving the indication of the multi-level coding scheme, with the network entity based at least in part on a coding scheme associated with a single encoding algorithm.

The adaptive encoding manager component 1108 may instruct the communication manager 140 to switch from communicating with the network entity based at least in part on the coding scheme associated with the single encoding algorithm to communicating with the network entity based at least in part on the multi-level coding scheme.

The transmission component 1104 may transmit a request associated with reducing power consumption by the UE, wherein receiving the indication of a multi-level coding scheme is based at least in part on transmitting the request. As one example, the transmission component 1104 may transmit a signal metric that indicates the first encoding algorithm and the second encoding algorithm provide performance within a threshold of one another.

The reception component 1102 may receive an indication to switch to the first multi-level coding scheme based at least in part on transmitting the signal metric. Based at least in part on the reception component receiving the indication, the adaptive encoding manager component 1108 may instruct the communication manager 140 to switch to communicating with the network entity based at least in part on the first multi-level coding scheme.

The number and arrangement of components shown in FIG. 11 are provided as an example. In practice, there may be additional components, fewer components, different components, or differently arranged components than those shown in FIG. 11. Furthermore, two or more components shown in FIG. 11 may be implemented within a single component, or a single component shown in FIG. 11 may be implemented as multiple, distributed components. Additionally, or alternatively, a set of (one or more) components shown in FIG. 11 may perform one or more functions described as being performed by another set of components shown in FIG. 11.

The following provides an overview of some Aspects of the present disclosure:

Aspect 1: A method of wireless communication performed by a network entity, comprising: transmitting, to a user equipment (UE), an indication of a multi-level coding scheme that specifies a first encoding algorithm associated with level 1 coding and a second encoding algorithm associated with level 2 coding based at least in part on power management; and communicating with the UE based at least in part on the multi-level coding scheme.

Aspect 2: The method of Aspect 1 further comprising: selecting the first encoding algorithm and the second encoding algorithm for the multi-level coding scheme based at least in part on reducing power consumption by an encoder or a decoder.

Aspect 3: The method of Aspect 2, further comprising: selecting the first encoding algorithm and the second encoding algorithm based at least in part on reducing power consumption by the UE.

Aspect 4: The method of any one of Aspects 1-3, further comprising: communicating, prior to transmitting the indication of the multi-level coding scheme, with the UE based at least in part on a coding scheme associated with a single encoding algorithm prior to transmitting the indication of the multi-level coding scheme; and switching from communicating with the UE based at least in part on the coding scheme associated with the single encoding algorithm to communicating with the UE based at least in part on the multi-level coding scheme.

Aspect 5: The method of any one of Aspects 1-5, wherein the multi-level coding scheme indicates: a first code rate associated with the level 1 coding, and a second code rate associated with the level 2 coding, wherein the second code rate is higher than the first code rate.

Aspect 6: The method of any one of Aspects 1-5, further comprising: selecting the multi-level coding scheme based at least in part on a bit ratio associated with partitioning a number of bits between the level 1 coding and the level 2 coding.

Aspect 7: The method of any one of Aspects 1-5, wherein the first encoding algorithm is based at least in part on a low-density parity-check encoding algorithm, and wherein the second encoding algorithm is based at least in part on a Reed-Solomon encoding algorithm.

Aspect 8: The method of any one of Aspects 1-5, wherein the first encoding algorithm is associated with a first power consumption by a first encoder or a first decoder, wherein the second encoding algorithm is associated with a second power consumption by a second encoder or a second decoder, and wherein the second power consumption is lower than the first power consumption.

Aspect 9: The method of Aspect 8, wherein the first encoder and the second encoder are a same encoder that is configured to switch between the first encoding algorithm and the second encoding algorithm.

Aspect 10: The method of Aspect 8, wherein the first encoder and the second encoder are different encoder modules.

Aspect 11: The method of any one of Aspects 1-10, further comprising: selecting the multi-level coding scheme based at least in part on a modulation and coding scheme (MCS) table that includes the multi-level coding scheme.

Aspect 12: The method of Aspect 11, wherein the indication specifies an index that maps to an entry in the MCS table associated with the multi-level coding scheme.

Aspect 13: The method of any one of Aspects 1-12, further comprising: receiving a request from the UE associated with reducing power consumption by the UE; and selecting the multi-level coding scheme based at least in part on receiving the request.

Aspect 14: The method of Aspect 13, wherein receiving the request further comprises: receiving the request implicitly by receiving a battery metric from the UE.

Aspect 15: The method of any one of Aspects 1-14, wherein the multi-level coding scheme that specifies the first encoding algorithm and the second encoding algorithm is a first multi-level coding scheme, and the method further comprises: communicating with the UE based at least in part on a second multi-level coding scheme that specifies to use the first encoding algorithm in a first configuration for the level 1 coding and a second configuration for the level 2 coding; and switching from communicating with the UE based at least in part on the second multi-level coding scheme to communicating with the network entity based at least in part on the first multi-level coding scheme.

Aspect 16: The method of Aspect 15, further comprising: identifying, while communicating with the UE based at least in part on the second multi-level coding scheme, that a code rate associated with the level 2 coding satisfies a weak threshold; and determining to switch to the first multi-level coding scheme based at least in part on identifying that the code rate satisfies the weak threshold.

Aspect 17: The method of Aspect 15 or Aspect 16, further comprising: receiving a signal metric that indicates the first encoding algorithm and the second encoding algorithm provide performance within a threshold of one another; and determining to switch to the first multi-level coding scheme based at least in part on the signal metric.

Aspect 18: A method of wireless communication performed by a user equipment (UE), comprising: receiving an indication of a multi-level coding scheme that specifies a first encoding algorithm associated with level 1 coding and a second encoding algorithm associated with level 2 coding based at least in part on power management; and communicating with a network entity based at least in part on the multi-level coding scheme.

Aspect 19: The method of Aspect 18, wherein the power management is based at least in part on reducing power consumption by an encoder or a decoder at the UE.

Aspect 20: The method of Aspect 18 or Aspect 19, further comprising: communicating, prior to receiving the indication of the multi-level coding scheme, with the network entity based at least in part on a coding scheme associated with a single encoding algorithm; and switching from communicating with the network entity based at least in part on the coding scheme associated with the single encoding algorithm to communicating with the network entity based at least in part on the multi-level coding scheme.

Aspect 21: The method of any one of Aspects 18-20, wherein the multi-level coding scheme indicates: a first code rate associated with the level 1 coding, and a second code rate associated with the level 2 coding, wherein the second code rate is higher than the first code rate.

Aspect 22: The method of any one of Aspects 18-21, wherein the first encoding algorithm is based at least in part on a low-density parity-check encoding algorithm, and wherein the second encoding algorithm is based at least in part on a Reed-Solomon encoding algorithm.

Aspect 23: The method of any one of Aspects 18-22, wherein the first encoding algorithm is associated with a first power consumption by a first encoder or a first decoder, wherein the second encoding algorithm is associated with a second power consumption by a second encoder or a second decoder, and wherein the second power consumption is lower than the first power consumption.

Aspect 24: The method of any one of Aspects 18-22, wherein the first encoder and the second encoder are a same encoder that is configured to switch between the first encoding algorithm and the second encoding algorithm.

Aspect 25: The method of any one of Aspects 18-22, wherein the first encoder and the second encoder are different encoder modules.

Aspect 26: The method of any one of Aspects 18-25, wherein the indication of the multi-level coding scheme is based at least in part on a modulation and coding scheme (MCS) table that includes the multi-level coding scheme.

Aspect 27: The method of Aspect 26, wherein the indication specifies an index that maps to an entry in the MCS table associated with the multi-level coding scheme.

Aspect 28: The method of any one of Aspects 18-27, further comprising: transmitting a request associated with reducing power consumption by the UE, wherein receiving the indication of a multi-level coding scheme is based at least in part on transmitting the request.

Aspect 29: The method of Aspect 28, wherein transmitting the request further comprises: transmitting the request implicitly by transmitting a battery metric associated with a battery at the UE.

Aspect 30: The method of any one of Aspects 18-29, wherein the multi-level coding scheme that specifies the first encoding algorithm and the second encoding algorithm is a first multi-level coding scheme, and the method further comprises: communicating with the network entity based at least in part on a second multi-level coding scheme that specifies to use the first encoding algorithm in a first configuration for the level 1 coding and a second configuration for the level 2 coding; and switching from communicating with the network entity based at least in part on the second multi-level coding scheme to communicating with the network entity based at least in part on the first multi-level coding scheme.

Aspect 31: The method of Aspect 30, further comprising: transmitting a signal metric that indicates the first encoding algorithm and the second encoding algorithm provide performance within a threshold of one another; and receiving an indication to switch to the first multi-level coding scheme based at least in part on transmitting the signal metric.

Aspect 32: An apparatus for wireless communication at a device, comprising a processor; memory coupled with the processor; and instructions stored in the memory and executable by the processor to cause the apparatus to perform the method of one or more of Aspects 1-17.

Aspect 32: An apparatus for wireless communication at a device, comprising a processor; memory coupled with the processor; and instructions stored in the memory and executable by the processor to cause the apparatus to perform the method of one or more of Aspects 18-31.

Aspect 33: A device for wireless communication, comprising a memory and one or more processors coupled to the memory, the one or more processors configured to perform the method of one or more of Aspects 1-17.

Aspect 33: A device for wireless communication, comprising a memory and one or more processors coupled to the memory, the one or more processors configured to perform the method of one or more of Aspects 18-31.

Aspect 34: An apparatus for wireless communication, comprising at least one means for performing the method of one or more of Aspects 1-17.

Aspect 34: An apparatus for wireless communication, comprising at least one means for performing the method of one or more of Aspects 18-31.

Aspect 35: A non-transitory computer-readable medium storing code for wireless communication, the code comprising instructions executable by a processor to perform the method of one or more of Aspects 1-17.

Aspect 35: A non-transitory computer-readable medium storing code for wireless communication, the code comprising instructions executable by a processor to perform the method of one or more of Aspects 18-31.

Aspect 36: A non-transitory computer-readable medium storing a set of instructions for wireless communication, the set of instructions comprising one or more instructions that, when executed by one or more processors of a device, cause the device to perform the method of one or more of Aspects 1-17.

Aspect 36: A non-transitory computer-readable medium storing a set of instructions for wireless communication, the set of instructions comprising one or more instructions that, when executed by one or more processors of a device, cause the device to perform the method of one or more of Aspects 18-31.

The foregoing disclosure provides illustration and description but is not intended to be exhaustive or to limit the aspects to the precise forms disclosed. Modifications and variations may be made in light of the above disclosure or may be acquired from practice of the aspects.

As used herein, the term "component" is intended to be broadly construed as hardware and/or a combination of hardware and software. "Software" shall be construed broadly to mean instructions, instruction sets, code, code segments, program code, programs, subprograms, software modules, applications, software applications, software packages, routines, subroutines, objects, executables, threads of execution, procedures, and/or functions, among other examples, whether referred to as software, firmware, middleware, microcode, hardware description language, or otherwise. As used herein, a "processor" is implemented in hardware and/or a combination of hardware and software. It will be apparent that systems and/or methods described herein may be implemented in different forms of hardware and/or a combination of hardware and software. The actual specialized control hardware or software code used to implement these systems and/or methods is not limiting of the aspects. Thus, the operation and behavior of the systems and/or methods are described herein without reference to specific software code, since those skilled in the art will understand that software and hardware can be designed to implement the systems and/or methods based, at least in part, on the description herein.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various aspects. Many of these features may be combined in ways not specifically recited in the claims and/or disclosed in the specification. The disclosure of various aspects includes each dependent claim in combination with every other claim in the claim set. As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Furthermore, as used herein, the terms "set" and "group" are intended to include one or more items and may be used interchangeably with "one or more." Where only one item is intended, the phrase "only one" or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. An apparatus for wireless communication at a network entity, comprising:
    a memory; and
    one or more processors, coupled to the memory, configured to:
        communicate with the UE based at least in part on a coding scheme associated with a single encoding algorithm;
        transmit, to a user equipment (UE) and after communicating based at least in part on the coding scheme associated with a single encoding algorithm, an indication of a multi-level coding scheme that specifies a first encoding algorithm associated with level 1 coding and a second encoding algorithm associated with level 2 coding based at least in part on power management; and
        switch from communicating with the UE based at least in part on the coding scheme associated with the single encoding algorithm to communicating with the UE based at least in part on the multi-level coding scheme.

2. The apparatus of claim 1, wherein the one or more processors are further configured to:
    select the first encoding algorithm and the second encoding algorithm for the multi-level coding scheme based at least in part on reducing power consumption by an encoder or a decoder.

3. The apparatus of claim 1, wherein the multi-level coding scheme indicates:
    a first code rate associated with the level 1 coding, and
    a second code rate associated with the level 2 coding,
    wherein the second code rate is higher than the first code rate.

4. The apparatus of claim 1, wherein the one or more processors are further configured to:
    select the multi-level coding scheme based at least in part on a bit ratio associated with partitioning a number of bits between the level 1 coding and the level 2 coding.

5. The apparatus of claim 4, wherein the first encoding algorithm is based at least in part on a low-density parity-check encoding algorithm, and
    wherein the second encoding algorithm is based at least in part on a Reed-Solomon encoding algorithm.

6. An apparatus for wireless communication at a network entity, comprising:
    a memory; and
    one or more processors, coupled to the memory, configured to:
        transmit, to a user equipment (UE), an indication of a multi-level coding scheme that specifies a first encoding algorithm associated with level 1 coding and a second encoding algorithm associated with level 2 coding based at least in part on power management;
        select the multi-level coding scheme based at least in part on a modulation and coding scheme (MCS) table that includes the multi-level coding scheme; and
        communicate with the UE based at least in part on the multi-level coding scheme.

7. The apparatus of claim 6, wherein the indication specifies an index that maps to an entry in the MCS table associated with the multi-level coding scheme.

8. An apparatus for wireless communication at a network entity, comprising:
a memory; and
one or more processors, coupled to the memory, configured to:
transmit, to a user equipment (UE), an indication of a multi-level coding scheme that specifies a first encoding algorithm associated with level 1 coding and a second encoding algorithm associated with level 2 coding based at least in part on power management; and
communicate with the UE based at least in part on the multi-level coding scheme; and
wherein the one or more processors are further configured to:
receive a request from the UE associated with reducing power consumption by the UE; and
select the multi-level coding scheme based at least in part on receiving the request.

9. An apparatus for wireless communication at a network entity, comprising:
a memory; and
one or more processors, coupled to the memory, configured to:
transmit, to a user equipment (UE), an indication of a multi-level coding scheme that specifies a first encoding algorithm associated with level 1 coding and a second encoding algorithm associated with level 2 coding based at least in part on power management; and
communicate with the UE based at least in part on the multi-level coding scheme; and
wherein the multi-level coding scheme is a first multi-level coding scheme, and wherein one or more processors are further configured to:
communicate with the UE based at least in part on a second multi-level coding scheme that specifies to use the first encoding algorithm in a first configuration for the level 1 coding and a second configuration for the level 2 coding; and
switch from communicating with the UE based at least in part on the second multi-level coding scheme to communicating with the network entity based at least in part on the first multi-level coding scheme.

10. The apparatus of claim 9, wherein the one or more processors are further configured to:
identify, while communicating with the UE based at least in part on the second multi-level coding scheme, that a code rate associated with the level 2 coding satisfies a weak threshold; and
determine to switch to the first multi-level coding scheme based at least in part on identifying that the code rate satisfies the weak threshold.

11. The apparatus of claim 9, wherein the one or more processors are further configured to:
receive a signal metric that indicates the first encoding algorithm and the second encoding algorithm provide performance within a threshold of one another; and
determine to switch to the first multi-level coding scheme based at least in part on the signal metric.

12. An apparatus for wireless communication at a user equipment (UE), comprising:
a memory; and
one or more processors, coupled to the memory, configured to:
communicate with the network entity based at least in part on a coding scheme associated with a single encoding algorithm
receive, after communication based at least in part on the coding scheme associated with the single encoding algorithm, an indication of a multi-level coding scheme that specifies a first encoding algorithm associated with level 1 coding and a second encoding algorithm associated with level 2 coding based at least in part on power management; and
switch from communicating with the network entity based at least in part on the coding scheme associated with the single encoding algorithm to communicating with the network entity based at least in part on the multi-level coding scheme.

13. The apparatus of claim 12, wherein the multi-level coding scheme indicates:
a first code rate associated with the level 1 coding, and
a second code rate associated with the level 2 coding,
wherein the second code rate is higher than the first code rate.

14. The apparatus of claim 13, wherein the first encoding algorithm is based at least in part on a low-density parity-check encoding algorithm, and
wherein the second encoding algorithm is based at least in part on a Reed-Solomon encoding algorithm.

15. An apparatus for wireless communication at a user equipment (UE), comprising:
a memory; and
one or more processors, coupled to the memory, configured to:
receive an indication of a multi-level coding scheme that specifies a first encoding algorithm associated with level 1 coding and a second encoding algorithm associated with level 2 coding based at least in part on power management; and
communicate with a network entity based at least in part on the multi-level coding scheme; and
wherein the indication of the multi-level coding scheme is based at least in part on a modulation and coding scheme (MCS) table that includes the multi-level coding scheme.

16. The apparatus of claim 15, wherein the indication specifies an index that maps to an entry in the MCS table associated with the multi-level coding scheme.

17. An apparatus for wireless communication at a user equipment (UE), comprising:
a memory; and
one or more processors, coupled to the memory, configured to:
receive an indication of a multi-level coding scheme that specifies a first encoding algorithm associated with level 1 coding and a second encoding algorithm associated with level 2 coding based at least in part on power management; and
communicate with a network entity based at least in part on the multi-level coding scheme; and
wherein the one or more processors are further configured to:
transmit a request associated with reducing power consumption by the UE,
wherein receiving the indication of a multi-level coding scheme is based at least in part on transmitting the request.

18. An apparatus for wireless communication at a user equipment (UE), comprising:
a memory; and
one or more processors, coupled to the memory, configured to:
receive an indication of a multi-level coding scheme that specifies a first encoding algorithm associated with level 1 coding and a second encoding algorithm associated with level 2 coding based at least in part on power management; and
communicate with a network entity based at least in part on the multi-level coding scheme; and
wherein the multi-level coding scheme is a first multi-level coding scheme, and wherein one or more processors are further configured to:
communicate with the network entity based at least in part on a second multi-level coding scheme that specifies to use the first encoding algorithm in a first configuration for the level 1 coding and a second configuration for the level 2 coding; and
switch from communicating with the network entity based at least in part on the second multi-level coding scheme to communicating with the network entity based at least in part on the first multi-level coding scheme.

19. The apparatus of claim 18, wherein the one or more processors are further configured to:
transmit a signal metric that indicates the first encoding algorithm and the second encoding algorithm provide performance within a threshold of one another; and
receive an indication to switch to the first multi-level coding scheme based at least in part on transmitting the signal metric.

20. A method of wireless communication performed by a network entity, comprising:
communicating with the UE based at least in part on a coding scheme associated with a single encoding algorithm;
transmitting, to a user equipment (UE) after communicating based at least in part on a coding scheme associated with a single encoding algorithm, an indication of a multi-level coding scheme that specifies a first encoding algorithm associated with level 1 coding and a second encoding algorithm associated with level 2 coding based at least in part on power management; and
switching from communicating with the UE based at least in part on the coding scheme associated with the single encoding algorithm to communicating with the UE based at least in part on the multi-level coding scheme.

21. The method of claim 20 further comprising:
selecting the first encoding algorithm and the second encoding algorithm for the multi-level coding scheme based at least in part on reducing power consumption by an encoder or a decoder.

22. The method of claim 20, further comprising:
selecting the multi-level coding scheme based at least in part on a bit ratio associated with partitioning a number of bits between the level 1 coding and the level 2 coding.

23. A method of wireless communication performed by a network entity, comprising:
transmitting, to a user equipment (UE), an indication of a multi-level coding scheme that specifies a first encoding algorithm associated with level 1 coding and a second encoding algorithm associated with level 2 coding based at least in part on power management; and
selecting the multi-level coding scheme based at least in part on a modulation and coding scheme (MCS) table that includes the multi-level coding scheme,
communicating with the UE based at least in part on the multi-level coding scheme.

24. A method of wireless communication performed by a user equipment (UE), comprising:
receiving an indication of a multi-level coding scheme that specifies a first encoding algorithm associated with level 1 coding and a second encoding algorithm associated with level 2 coding based at least in part on power management; and
communicating with a network entity based at least in part on the multi-level coding scheme;
wherein the indication of the multi-level coding scheme is based at least in part on a modulation and coding scheme (MCS) table that includes the multi-level coding scheme.

25. The method of claim 24, wherein the multi-level coding scheme that specifies the first encoding algorithm and the second encoding algorithm is a first multi-level coding scheme, and the method further comprises:
communicating with the network entity based at least in part on a second multi-level coding scheme that specifies to use the first encoding algorithm in a first configuration for the level 1 coding and a second configuration for the level 2 coding; and
switching from communicating with the network entity based at least in part on the second multi-level coding scheme to communicating with the network entity based at least in part on the first multi-level coding scheme.

26. The method of claim 24, further comprising:
transmitting a signal metric that indicates the first encoding algorithm and the second encoding algorithm provide performance within a threshold of one another; and
receiving an indication to switch to the multi-level coding scheme based at least in part on transmitting the signal metric.

* * * * *